United States Patent
Keränen et al.

(10) Patent No.: US 11,817,534 B1
(45) Date of Patent: Nov. 14, 2023

(54) OPTICALLY FUNCTIONAL MULTILAYER STRUCTURE AND RELATED METHOD OF MANUFACTURE

(71) Applicant: TactoTek Oy, Oulunsalo (FI)

(72) Inventors: Antti Keränen, Oulunsalo (FI); Sami Torvinen, Oulunsalo (FI); Tero Heikkinen, Oulunsalo (FI); Pasi Korhonen, Oulunsalo (FI); Pälvi Apilo, Oulunsalo (FI); Mikko Heikkinen, Oulunsalo (FI); Jarmo Sääski, Oulunsalo (FI); Paavo Niskala, Oulunsalo (FI); Ville Wallenius, Oulunsalo (FI); Heikki Tuovinen, Oulunsalo (FI); Janne Asikkala, Oulunsalo (FI); Taneli Salmi, Oulunsalo (FI); Suvi Kela, Oulunsalo (FI); Outi Rusanen, Oulunsalo (FI); Johanna Juvani, Oulunsalo (FI); Mikko Sippari, Oulunsalo (FI); Tomi Simula, Oulunsalo (FI); Tapio Rautio, Oulunsalo (FI); Samuli Yrjänä, Oulunsalo (FI); Tero Rajaniemi, Oulunsalo (FI); Simo Koivikko, Oulunsalo (FI); Juha-Matti Hintikka, Oulunsalo (FI); Hasse Sinivaara, Oulunsalo (FI); Vinski Bräysy, Oulunsalo (FI); Olimpia Migliore, Oulunsalo (FI); Juha Sepponen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 17/856,958

(22) Filed: Jul. 2, 2022

(51) Int. Cl.
*H01L 33/60* (2010.01)
*H01L 33/62* (2010.01)
(Continued)

(52) U.S. Cl.
CPC .......... *H01L 33/60* (2013.01); *H01L 25/0753* (2013.01); *H01L 33/005* (2013.01);
(Continued)

(58) Field of Classification Search
CPC ..... H01L 2933/0058; H01L 2933/0066; H01L 33/60; G02B 6/0011; G02B 6/0033;
(Continued)

(56) References Cited

U.S. PATENT DOCUMENTS 10,288,800 B1 * 5/2019 Keränen ................ G02B 1/045

FOREIGN PATENT DOCUMENTS

DE 102018117536 A1 * 1/2019 ................ F21S 4/22

OTHER PUBLICATIONS ffice Action issued by the United States Patent and Trademark Office in relation to U.S. Appl. No. 18/339,427 dated Aug. 25, 2023 (6 pages).

* cited by examiner

*Primary Examiner* — Antonio B Crite
(74) *Attorney, Agent, or Firm* — Robert P. Michal, Esq.; Carter, DeLuca & Farrell LLP

(57) ABSTRACT

An integrated optically functional multilayer structure includes a flexible, substrate film arranged with a circuit design including at least a number of electrical conductors preferably additively printed on the substrate film; a light source provided upon a first side of the substrate film to internally illuminate at least portion of the structure for external perception; an optically transmissive plastic layer produced upon the first side of the substrate film, said plastic layer at least laterally surrounding, the light source, the substrate film at least having a similar or lower refractive index therewith; and a reflector design comprising at least one material layer, said reflector design being configured to (Continued)

reflect, the light emitted by the light source and incident upon the reflector design.

16 Claims, 9 Drawing Sheets

(51) Int. Cl.
*H01L 25/075* (2006.01)
*H01L 33/00* (2010.01)
(52) U.S. Cl.
CPC ...... *H01L 33/62* (2013.01); *H01L 2933/0058* (2013.01); *H01L 2933/0066* (2013.01)
(58) Field of Classification Search
CPC .... G02B 6/005; G02B 6/0013; G02B 6/0031; G02B 1/045; F21Y 2115/10; F21Y 2115/15
See application file for complete search history.

1200    SKELETONIZED TOP/BOTTOM VIEW

1202    A – A SKELETONIZED SIDE VIEW

1204    B – B SKELETONIZED CROSS-SECTIONAL VIEW

OPTICALLY FUNCTIONAL MULTILAYER STRUCTURE AND RELATED METHOD OF MANUFACTURE

FIELD OF THE INVENTION

The present invention relates in general to functional, integrated structures incorporating various functional features such as electronic, mechanical or optical elements. In particular, however not exclusively, the present invention concerns the provision of such structures comprising at least one or more optoelectronic light sources.

BACKGROUND

There exists a variety of different stacked assemblies and multilayer structures in the context of different functional ensembles e.g., in the field of electronics and electronic products. The motivation behind the integration of functionalities involving e.g., electronics, mechanical or optical features may be as diverse as the related use contexts. Relatively often size savings, weight savings, cost savings, or just efficient integration of components is sought for when the resulting solution ultimately exhibits a multilayer nature. In turn, the associated use scenarios may relate to product packages or casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to produce electronics directly and additively to the associated substrate. The term "printed" refers in this context to printing techniques capable of producing electronics/electrical elements from the printed matter, including but not limited to screen printing, flexography, and inkjet printing, through a substantially additive printing process. The used substrates may be flexible, stretchable and printed materials organic, which is however, not always the case.

Furthermore, the concept of injection molded structural electronics (IMSE) involves building functional devices and parts therefor in the form of a multilayer structure, which encapsulates electronic functionality as seamlessly as possible. Characteristic to IMSE is also that the electronics is commonly manufactured into a true 3D (non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment. Further layers and elements may be naturally added to the construction.

Optical features and functionalities to be provided in the afore-discussed integrated structures may include a number of light sources that are intended to illuminate e.g., selected internals of the structure or the environment of the structure. Illumination may have different motives per se, such as decorative/aesthetic or functional, such as guiding or indicative, motives.

For example, in some use scenarios the environment should be lit for increased visibility in gloomy or dark conditions, which may, in turn, enable trouble-free performing of various human activities typically requiring relatively high lighting comfort, such as walking, reading, or operating a device, to take place. Alternatively, the illumination could be applied to warn or inform different parties regarding e.g., the status of the structure or a related host device, or a connected remote device, via different warning or indicator lights and e.g., associated graphics. Yet, the illumination might yield the structure or its host a desired appearance and visually emphasize its certain areas or features by a desired color or brightness. Accordingly, the illumination could also be applied to instruct a user of the structure or its host device about e.g., the location of different functional features such as keys, switches, touch-sensitive areas, or other UI (user interface) features on the device surface, or about the actual function underlying the illuminated feature.

Various challenges may commonly emerge in the described and other illumination applications and use scenarios, however.

For example, undesired light bleed or leakage out of the structure or between different internal volumes and areas thereof may easily cause both functional and aesthetic issues not forgetting transmission losses from the standpoint of a desired optical path and original illumination target, as being easily comprehended by a person skilled in the art. Yet, the perceivability of light sources themselves is one potential further issue. In some applications, the light sources should preferably remain hidden or only weakly or occasionally exposed.

Additionally, achieving sufficient resolution and in many cases, also dynamic or adaptive, control of internally transmitted and ultimately outcoupled light in terms of e.g., illuminated surface area shape, size, or location may at least occasionally turn out difficult with highly integrated structures. In various solutions, controlling or specifically, improving e.g., the uniformity of light over its outcoupling surface, which may sometimes also span considerably large areas in relation to the overall dimensions of the structure or its selected surface, has been previously found burdensome. The same applies to spatial control of illumination and light outcoupling also more generally. This may be an important issue e.g., when the surface contains e.g., an icon or symbol to be evenly lit to indicate to a viewer external to the structure that a device functionality or status associated with the icon or symbol is active, for example. Simply harnessing several light sources to more effectively lit up a joint target area or feature, such as an icon, may still cause illumination hot spots and additional leakage while also requiring more, often precious, power and space. Obtaining decent mixing of brightness or colors may also be challenging and require a relatively long distance between the light source(s) and area or feature to be illuminated therewith especially in large area illumination applications, which adds to the size of the structure required or reduces the area that can be illuminated with proper mixing performance.

Still, some, in many ways generally favourable, light sources such as e.g., high-power LEDs may consume somewhat remarkable power (easily in the order of magnitude of about 1 watt or more) and eventually end up so hot that they degrade or break. They may also damage adjacent heat-sensitive elements such as plastic substrates.

Adding multiple, potentially complex light guiding, incoupling, outcoupling, limiting or generally processing elements into the structure has, in turn, its own drawbacks such as increased space consumption, weight and other design constraints. Maintaining the optical performance of the structure high, with reference to e.g., low leakage, loss, and similar objectives, may easily further limit the shape of the structure or included elements to ones otherwise suboptimum in their intended use case.

Yet, if the optical features such as illumination features are to be combined with other features in the structure, the other features may negatively affect the lighting performance due to their shadowing or masking effect, for example, and occasionally also the optical features may prevent or complicate the implementation of the other features due to e.g., space constraints faced.

Manufacturing process-wise the adoption of various optical features in the structures may increase besides the overall process complexity also the amount of faced complications due to the added features' mutual (in)compatibility or (in)compatibility with the remaining materials and features as well as related process phases, considering e.g., overmolding, resulting in an increased fail rate/reduce yield. For example, if a material associated with a lower melt temperature (e.g. polymethyl methacrylate, PMMA) is utilized together with a higher melt temperature molding material (e.g. polycarbonate, PC), features printed or otherwise established on the lower melt temperature material may degrade or wash out during molding.

SUMMARY

The objective of the present invention is to at least alleviate one or more of the drawbacks associated with the known solutions in the context of optically functional integrated structures and related methods of manufacture.

The objective is achieved with various embodiments of an integrated, functional multilayer structure and a related method of manufacture for providing the multilayer structure.

According to one aspect, an integrated optically functional multilayer structure comprises a flexible, optionally 3D-formable and thermoplastic, substrate film, optionally being a single-layer or multilayer film, arranged with a circuit design comprising at least a number of electrical conductors, such as traces and/or contact pads, preferably additively printed on the substrate film;

a light source provided upon a first side of the substrate film to internally illuminate at least portion of the structure for external perception;

an optically transmissive plastic layer, optionally of thermoplastic material such as polycarbonate among many other feasible material options, produced, preferably molded, upon the first side of the substrate film and preferably upon the light source, said plastic layer at least laterally surrounding, optionally also at least partially covering, the light source, the substrate film optionally comprising material or material layer same as that of the plastic layer or at least having a similar or lower refractive index therewith; and a reflector design comprising at least one material layer optionally including electrically conductive material, said reflector design being configured to reflect the light emitted by the light source and incident upon the reflector design preferably towards the plastic layer.

In a further aspect, a method for manufacturing an integrated optically functional multilayer structure, comprises:

obtaining a flexible, optionally 3D-formable and thermoplastic, substrate film, optionally a multilayer film, provided with a circuit design comprising at least a number of electrical conductors, such as traces and/or contact pads, preferably additively produced such as printed on the substrate film;

arranging at least one light source upon a first side of the substrate film;

producing, optionally through molding or 3D printing, an optically transmissive plastic layer upon the first side of the substrate film and preferably upon said at least one light source, said plastic layer at least laterally surrounding or neighbouring, optionally also at least partially covering, the light source, said plastic layer thus potentially at least partially embedding the light source; and providing, optionally including printing, coating, laminating or molding, a reflector design comprising at least one material layer, optionally comprising a stack of material layers and/or a layer of preferably electrically conductive and/or metallic material, said reflector design being configured to reflect, optionally dominantly specularly, the light emitted by the at least one light source and incident upon the reflector design, preferably towards the plastic layer.

The present solution yields different advantages over a great variety of previously applied solutions, naturally depending on each embodiment thereof.

For example, incoupling, transmission and (out)coupling of light may be effectively controlled and related optical efficiency and various other characteristics of interest, such as achieved illumination uniformity, optimized in a concerned optical structure by clever, joint configuration of the included materials and elements such light sources, with respect to e.g., their mutual positioning, orientation, dimensions and other characteristics. The solution also suits large area illumination applications particularly well and facilitates reducing or keeping the number of required light sources low, which has its clear advantages in terms of space savings, power consumption, structural and manufacturing complexity, weight, etc.

E.g., embedded mirror type reflectors may be arranged opposite or next to the light sources, using e.g. conductive, typically metallic materials or a multitude of varying refractive index layers, to enable efficient transmission and control of light within the structure. Yet, total internal reflection (TIR) capable interfaces may be additionally configured to supplement and, for example, stack with mirror reflectors for even more sophisticated and flexible control of light conveyance.

The "hidden until lit" effect may also be produced. For instance, graphical symbols provided in the structure, various components, or e.g., conductive traces can be obscured from external visual perception until a light source intended and targeted to illuminate them is activated.

Manufacturing-wise printing and other cost-efficient, flexible and versatilely controllable methods, such as various molding and coating techniques may be cleverly applied to manufacture desired features in addition to the use of ready-prepared elements such as films, components, or modules.

By properly configuring the light source(s) and e.g., the suggested reflector design, also mixing characteristics of light on the outcoupling surfaces along the transmissive plastic layer and the outer surface of the structure in general may be enhanced and thus a so-called mixing distance needed for achieving the desired mixing performance reduced.

Optical elements such as outcoupling elements may be integrally and monolithically formed in other elements such as material layers advantageously by locally deforming the associated materials, which provides very efficient optical solutions as well as yields space, material, and weight savings in addition to simplifying the structure and potentially also the manufacturing process among other benefits. For example, mirror effect provided by the reflector design may be locally destroyed to establish a light outcoupling element from the deformed portion, or material(s) at a TIR-enabling interface could be similarly treated to locally alter the interface's properties for enhanced scattering and/or interfering TIR, for instance.

Adhesion between materials may be improved and e.g., wash-out issues may be reduced by utilizing multiple layers or multilayer elements so that the materials neighbouring the typically molded transmissive layer are selected so as to better survive molding and other processes as well as also attach to each other or the transmissive layer securely. For example, optionally co-extruded multilayer film(s) such as PC/PMMA film(s) could be used in a stack structure over and/or below the transmissive layer comprising e.g., PC resin then injection molded or otherwise produced on the PC layer of the multilayer film or between the PC layers of two multilayer films. Yet, also e.g., printed outcoupling elements could be provided on the PC surfaces with standard and many ways advantageous PC surface inks. In addition, using a co-extruded multilayer films reduces adhesion issues between different material layers as the adhesion gained from the film co-extruding process is excellent. Different co-extruded material combinations with even better refractive index differences can be utilized.

The suggested multilayer may be modular and put together using a plurality of mutually different and/or similar modules providing different features to the aggregate structure. For instance, IMSE piece or cell type modules, which are preferably shaped (e.g. hexagonal/honeycomb cell) so that they can be fixed to each other straightforwardly, like the pieces of a puzzle, may be utilized. Some module(s) may contain more features or functionalities, more complex functionalities, harder to implement functionalities, or functionalities of several types such as general electronics and/or optoelectronics such as light sources, while some other module(s) may be simpler and contain mainly e.g., passive optical (transmissive material, reflector, mask, etc.) or other features conveniently manufacturable and usable for scaling the size of the structure, for example. The modules may support snap-fit joints or crimp fixing for easy mutual fixing, for example. Besides a modular single structure, several multilayer structures may be joined, optionally stacked, together to form even larger ensembles. Accordingly, modularity may be cleverly provided on different levels and resolutions.

Different embodiments of the present invention may be versatilely utilized and included in different applications, e.g., in electronic or electronics-containing appliances including but not limited to computers, tablets, smartphones, other communication devices, wearables, av equipment, optical devices, domestic appliances, vehicles, displays, panels, medical devices, smart clothing, furniture, pieces of art, etc.

Various additional utilities different embodiments of the present invention offer will become clear to a skilled person based on the following more detailed description.

The expression "a number of" may herein refer to any positive integer starting from one (1).

The expression "a plurality of" may refer to any positive integer starting from two (2), respectively.

The terms "first" and "second" are herein used to distinguish one element from other element(s), and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also un-recited features. The features recited in various embodiments and e.g., dependent claims are mutually freely combinable unless otherwise explicitly stated.

BRIEF DESCRIPTION OF FIGS.

Selected embodiments of the present invention are illustrated by way of example, and not by way of limitation, in the figures of the appended drawings.

DETAILED DESCRIPTION OF SOME EMBODIMENTS

Figure 1:
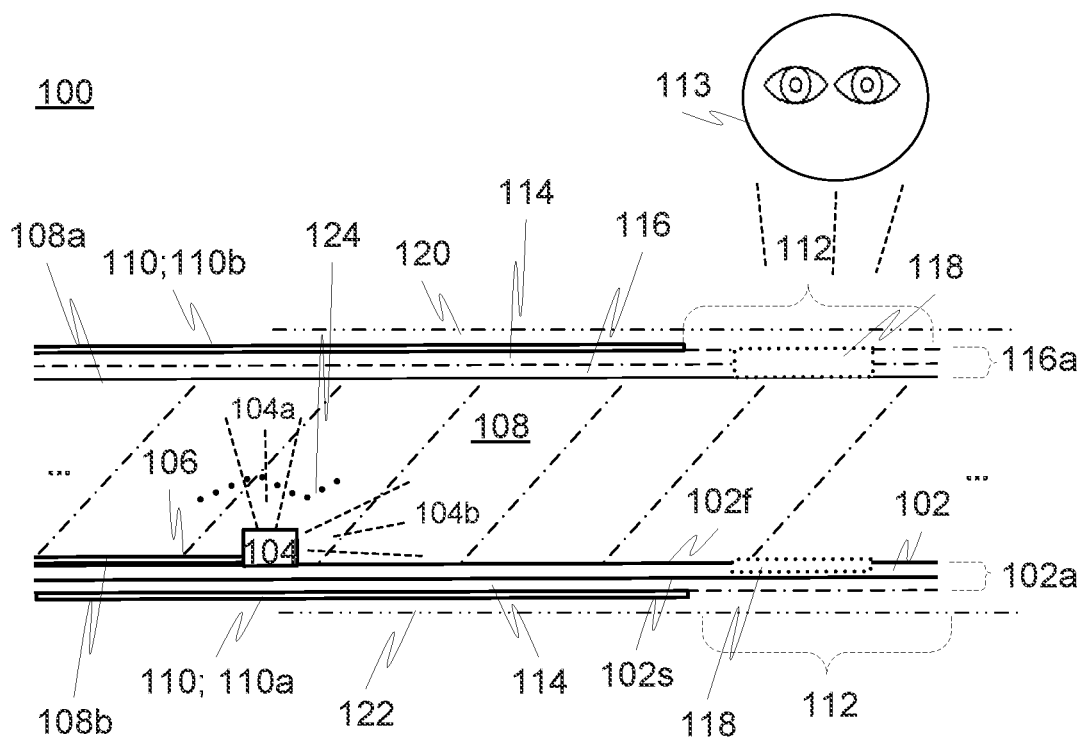
FIG. 1 illustrates various features and aspects of the present invention via an embodiment of a multilayer structure in accordance therewith.

FIG. 1 generally illustrates, at 100, via a cross-sectional sketch, an embodiment of a multilayer structure in accordance with the present invention.

The multilayer structure includes at least one substrate film 102, which is preferably of flexible and 3D-formable (3D-shapeable) material, such as thermoformable (plastic) material. As being comprehended by a person skilled in the art, instead of a single, optionally monolithic film 102, there could be a multilayer and/or multi-section construction type film 102a with mutually different layers at least in places, for instance, including also a hosting layer for the electronics. Such multilayer film 102a could manufactured by co-extruding, for example, as a part of an embodiment of a method contemplated hereinlater.

Item 108 refers to at least one, preferably also thermoplastic while at least optically transmissive layer preferably provided by molding upon the substrate film 102. Optionally, the layer 108 may have been produced essentially between the substrate film 102 and possible further element(s) or generally, material layer(s), such as at least one further layer or film different from or similar to the film 102, for example. Item 108 may alternatively refer to a plurality of stacked, preferably still thermoplastic and/or integrated, layers that may have been optionally produced by multi-shot molding. The layer 108 should be able to convey light at least having regard to selected wavelengths such as substantially all or selected wavelengths of visible light, or generally at least part of the wavelengths emitted by the included light source(s), which typically while not necessarily include visible wavelengths.

The layer 108 comprises a first side and a related first surface 108a that may be targeted towards the use environment of the structure and e.g., a user 113 of the structure located in such environment, depending on the application. Yet, the layer 108 comprises an opposite second side and associated second surface 108b essentially facing at least one instance of the film 102 and potentially a host device or structure, for instance. In alternative embodiments, however, the surface 108b may be the one that essentially faces the use environment and e.g., user therein instead of or in addition to the surface 108a.

As the layer 108 is indeed supposed to convey or guide light, it shall comprise optically at least translucent, optionally substantially transparent, material, wherein the optical transmittance of the overall thermoplastic layer may in some use scenarios preferably be at least 50%, but the desired transmittance may indeed radically differ between all possible use scenarios. In some embodiments at least about 80% or 90% transmittance could be preferred for maximizing the light output from the structure and low losses, while in some other scenarios lower figures could be quite sufficient if not even advantageous, if e.g., light leakage related issues are to be minimized. The transmittance may be defined or measured in a selected direction, e.g., main direction of light propagation and/or in a transverse direction (i.e., thickness direction) to the surface of the substrate film 102, having regard to the wavelengths of interest, typically including visible wavelengths as discussed above.

Suitable translucency or optical attenuation of the layer 108 could in some embodiments be reached by employing scattering elements such as particles in the used material, for example. When the amount of scattering elements is increased, scattering/diffusion and half power angle, as one possible measurable indicator, are increased as well while luminous transmission through the layer will generally decrease. Correspondingly, increasing layer thickness generally increases scattering/diffusion properties such as the half power angle and decreases transmission.

In terms of applicable materials, the layer 108 may generally comprise, for example, at least one material selected from the group consisting of: polymer, organic material, biomaterial, composite material, thermoplastic material, thermosetting material, elastomeric resin, PC, PMMA, ABS, PET, copolyester, copolyester resin, nylon (PA, polyamide), PP (polypropylene), TPU (thermoplastic polyurethane), polystyrene (PS or GPPS, general-purpose-polystyrene), TPSiV (thermoplastic silicone vulcanizate), and MS resin.

The substrate film 102 may optionally comprise material or material layer same as that of the layer 108 or at least having a similar or lower refractive index therewith. Accordingly, the resulting interface 102, 108 may be made optically transparent or enabling a total internal reflection (TIR) type function, respectively, for light arriving at the interface from withing the layer 108.

In some embodiments, tinted or more strongly colored resin as the material of layer 108 may provide a feasible option for limiting undesired light leakage within and outside the structure 100 to close elements or generally distances, and hide the internals such as light source 104 or other circuitry from external perception. Originally optically substantially clear base material such as PC or other plastic resin could be thus doped with a colored masterbatch. In many use scenarios wherein the structure 100 should be only e.g., few millimeters or a centimeter thick in total, whereupon the thermoplastic layer 108 should be even thinner, using about 2-4 mm, such as 3 mm, thick layer of plastic resin provided with a selected masterbatch (e.g. white or desired selective wavelength resin, optionally also e.g. IR (infrared) resin that might find use e.g., IR remote control applications) in a desired concentration (e.g. let-down ratio of about 1%) for establishing the layer 108, may provide quite satisfying results. Generally, in many embodiments in the context of the present invention, a feasible let-down (dosing or doping) ratio is indeed about 5%, 4%, 3%, 2%, 1% or less. For example, suitable industrial grade masterbatches for the purpose are provided by Lifocolor™. A so-called "hidden until lit" effect may be achieved for the light source 104 or other features included in the structure 100, for instance, by adding translucent, e.g. a selected color exhibiting, masterbatch in the injection molded base resin constituting the layer 108.

Item 124 refers to an overcoat at least partially covering a light emitting portion of the light source, said overcoat layer comprising optically transmissive material optionally having a higher refractive index than the plastic layer.

The overcoat 124 may include encapsulant, glob top or other conformal coating, such as a Illumabond™ or Triggerbond™ for light shaping or other processing, protecting and/or securing purposes, for instance. The used substance may be dispensed on top of selected circuitry such as the light source 104 or other electronics included in the structure. The substance may be substantially clear (transparent), for example. Alternatively, it could be colored and/or translucent. In some embodiments, a specific optical function or feature such as a lens may be provided by the encapsulant. The lens could be diffusive, Fresnel or e.g., collimating, for example. Additionally or alternatively, a pre-made lens or generally optical component is possible to include in the structure as well, either on the surface or embedded.

The substrate film 102 and/or further film(s) or generally material layer(s) included in the multilayer structure may comprise at least one material selected from the group consisting of: polymer, thermoplastic material, electrically insulating material, PMMA (Polymethyl methacrylate), Poly Carbonate (PC), flame retardant (FR) PC film, FR700 type PC, copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

Depending on the embodiment in question, the substrate film 102 and/or further film(s) or layers potentially included in the structure may comprise or be of optically substantially transparent or at least translucent material(s) having regard to the wavelengths of interest, such as visible light, with associated optical transmittance of about 80%, 90%, 95%, or more, for example. This may be the case especially when the substrate film 102 is configured in the structure 100 so as to effectively convey or pass light emitted by the light source 104. Yet, in some embodiments the used substrate film 102 could be substantially opaque, black and/or otherwise exhibitive of dark colour, to block incident light from passing through it (mask function).

The thickness of the film 102 and optionally of further film(s) or layer(s) included in the structure 100 may vary depending on the embodiment; it may only be of few tens or hundreds of a millimeter, or considerably thicker, in the magnitude of one or few millimeter(s), for example.

The thickness of the layer 108 may also be selected case-specifically but thicknesses of few millimeters, such as about 3-5 millimeters, may be applied. In some embodiments, only about 2 millimeter thickness or less, potentially only e.g., few tenths of a millimeter, could be sufficient if not optimum, while in some other embodiments the thickness could be considerably more as well, e.g. about 1 cm or more at least in places. The thickness may indeed locally vary. The layer 108 may optionally comprise recesses or internal cavities for light guiding, processing, and/or thermal management purposes, for instance, in addition to accommodating various elements such as electronic or optical elements.

The film 102, the layer 108 as well as further layers such as films, coatings, etc. of the structure may be essentially planar (width and length greater, e.g., different in the order of magnitude, than the thickness). The same generally applies also to the overall structure as illustrated in the figs even though also other, non-planar shapes are fully feasible.

Item 104 refers to a light source preferably of optoelectronic type. The light source 104 may be or comprise a semiconductor, a packaged semiconductor, a chip-on-board semiconductor, a bare chip, electroluminescent and/or a printed type light source, preferably a LED (light-emitting diode) or OLED (organic LED). The light source 104 may be of top-shooting and bottom installed, of or side-shooting type. Still, multi-side shooters or bottom-shooters may be utilized depending on the characteristics of each particular use case.

Still packaging-wise, the light source 104 could be optionally of flip-chip type. In some embodiments, the light source may contain multiple (two, three, four, or more) light-emission units such as LEDs packaged or at least grouped together. For example, a multi-color or specifically RGB LED of several LED emitters could be provided within a single package.

The light source 104 is provided, such as fabricated (optionally printed with reference to e.g., OLED) or, in the case of at least partially ready-made component, mounted on the substrate film 102, preferably on a first side 102f and associated surface thereof, which faces the transmissive layer 108 instead of the opposite second side 102s and surface of the film 102. Yet, additional host layer(s) such as films may be included in the structure for accommodating further elements such as light sources or other electronics. For mounting, e.g., adhesive (conductive or non-conductive) may be generally applied.

The light source 104 may be at least partially embedded in the material of the layer 108 during overmolding or otherwise preparing of the layer 108 thereon.

The layer 108 may include one or more light outcoupling areas 112 on any side of the layer 108, such as first 108a or second 108b side, through which the light originally emitted by the light source 104, incoupled into and propagated within the layer 108 is to be outcoupled to the surrounding layer(s) and/or the environment. The light source 104 may be positioned as desired having regard to the respective outcoupling area(s) 112. The source 104 may be located close to an area 112 so that even a related direct optical path, without reflections, is available from the emission surface(s) of the source 104. Alternatively and perhaps more commonly, the source 104 is a located aside and farther away from the associated outcoupling area(s) (e.g., out of LOS, line-of-sight, from the area or external environment adjacent the area) due to a variety of reasons, which may include hiding or masking the source 104 better from external perception or enhancing the uniformity of illumination (e.g., brightness and/or color(s)) on the area(s) 112 by letting the light emitted by the source 104 to propagate within the layer 108 and at neighbouring layers or material interfaces, primarily or also by reflections, for a longer distance and period in favour of improved mixing, for example. FIG. 1 shows only a single light source 104 for improved clarity, and in many embodiments one source 104 might be sufficient if not advantageous, but as being easily comprehended by a person skilled in art, there are countless embodiments e.g., in the field of large area illumination that might benefit from including several sources 114 on the same or different substrates (and utilizing shared or separate transmissive layer(s) 108 and/or reflector design(s) 110) in the structure, either having at least partially joined or separate outcoupling area(s) 112 associated with them, affecting the positioning and orientation of the light sources 104.

Item 106 refers to a circuit design in the form of electrical, optionally additively produced such as screen printed or otherwise printed, conductors such as traces and/or contact pads, which may optionally further act as thermal conductors. The conductors may be used for power and data transfer purposes, for example, between the elements of the structure 100 and/or with external elements. The circuit design 106 may provide control signal and power to the light source 104 from a controller and power circuit(s), respectively, among other uses. The circuit design 106 may connect to an external device via e.g., wiring- or connector-containing exterior surface or edge of the structure 100. Additionally or alternatively, wireless connectivity may be applied based on e.g., electromagnetic or particularly, inductive coupling among other options.

The light source 104 may be emissive as indicated by the dotted lines 104a (top shooting), 104b (side shooting) extending from the source 104 into the transmissive layer 108.

Item 110 and sub-items 110a, 110b, 110c (see FIG. 2) refer to a reflector design, which may also be of single-part or multi-part (multi-portion) construction. Two or more parts of the multi-part construction solution do not have to physically directly connected as they may reside on the opposite sides 108a, 108b of the layer 108, for instance or otherwise separated by a distance. Yet, any of the parts, or portions, may include one or more material layers e.g., as stacked, as their constituent elements.

Accordingly, the reflector design 110 comprises least one material layer. The reflector design 110 is configured to reflect, preferably dominantly specularly, the light originally emitted by at least one light source 104 and incident upon the reflector design 110.

One or more portions of the reflector design 110, or the whole design 100, may be located on a side of the plastic layer equal (see reflector/reflector portion 110a for illustration), opposite (see reflector/reflector portion 110b for illustration), and/or transverse (see especially reflector/reflector portion 110c for illustration) to a side facing the first side 102f of the substrate film 102 hosting the light source 104.

In preferred embodiments, the reflector design 110 or at least a portion thereof is typically configured to reflect the incident light that has previously propagated typically inside the (transmissive) layer 108 to at least roughly towards, or back towards, the layer 108 to prevent e.g., undesired light outcoupling from the structure 100 or light leakage, for instance. In some embodiments, the reflector design 110 may comprise at least a portion that is, in turn, configured to direct the incident light to alternative direction such as outside the layer 108 or the whole structure 100.

Further, the reflector design 110 may be configured on or in the layer 108 to reflect and steer light emitted by the light source 104 and incident on the reflector design 110 to propagate towards an outcoupling area 112, 112a, 112b, 112c. In some embodiments to be discussed also hereinafter, the reflector design 110 may be configured to direct the incident light more towards a surface normal of the layer 108 for outcoupling the light at least from the layer 108 or the overall structure.

Figure 2:
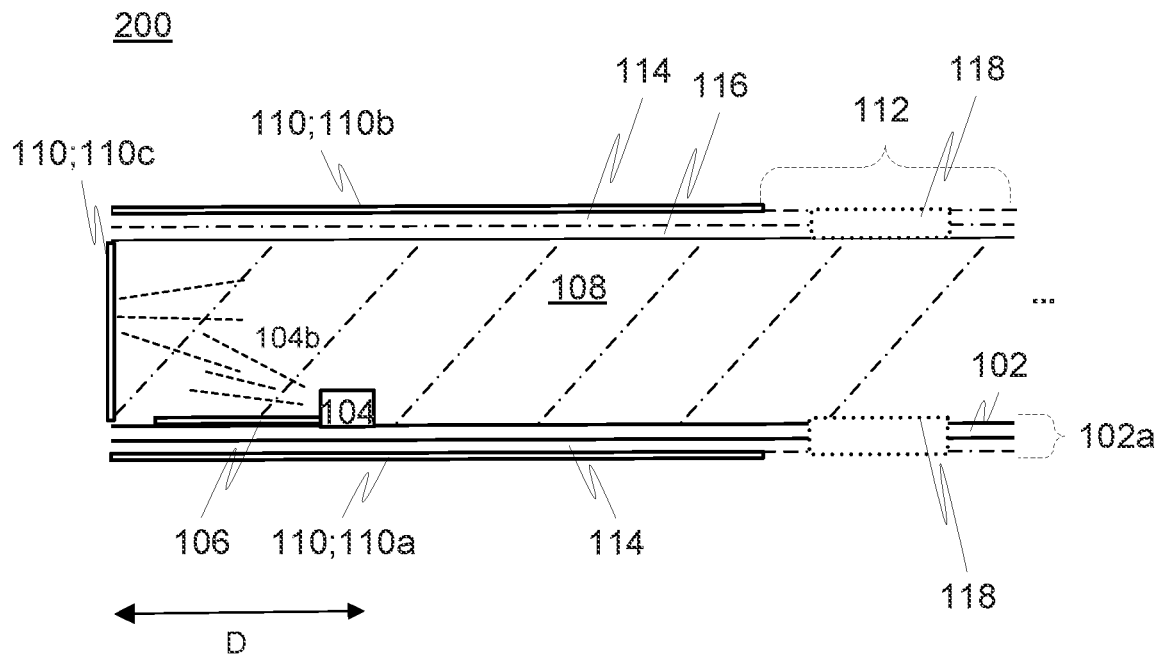
FIG. 2 illustrates a further applicable configuration of the reflector design in different embodiments of the present invention.
Figure 3:
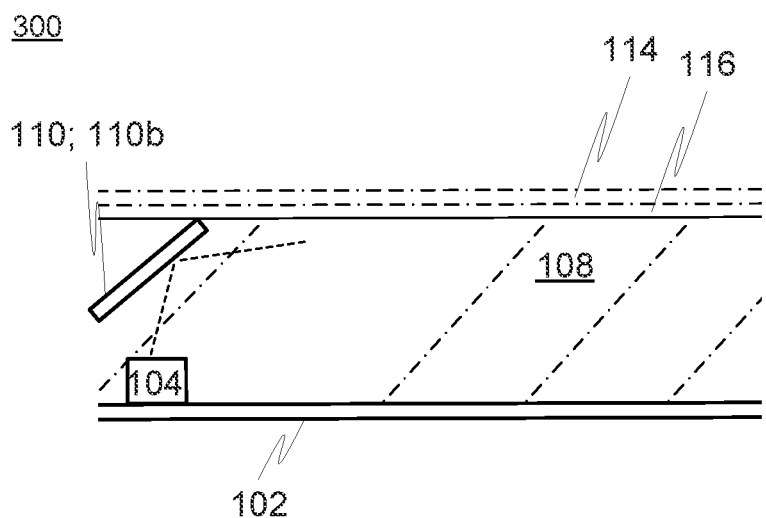
FIG. 3 illustrates a further applicable configuration of the reflector design in different embodiments of the present invention.

Indeed, with reference to e.g., sketches in FIGS. 2 and 3, for example, the reflector design 110 may be configured at least in connection with light incoupling from the light source 104.

The reflector design 110 or at least portion thereof may be located (110a),110b, 110c on a direct optical emission path from the light source 104. Further, the reflector design 110 may be located or comprise a portion 110b that is located upon and/or opposite to the light source 104 (e.g., on the opposite side 108a of the layer 108 with respect to the light source 104), aside from and/or under the light source 104 so that the design 110 receives and reflects and at least part of the light emitted by the light source 104.

As illustrated, by way of example only, in FIG. 3 at 300, the reflector design or a portion thereof 110b may be configured so as to reflect light incoupled into the layer 108 from the light source 104 and incident on the reflector design 110 to align more with a lateral plane of the layer 108 substantially transverse to a surface normal of the layer 108.

Generally, a portion of the reflector design 110, 110a, 110b, 110c may be located at least partially embedded in the layer 108, and/on the surface 108a, 108b of it.

And as well illustrated, by way of example, in FIG. 2 at 200, the light source 104 may be located between at least a portion of the reflector design 110c that is preferably aligned substantially perpendicular to the light outcoupling area and the light outcoupling area 112. The light source 104 may be then aligned in terms of its primary emission direction to point at least partially towards the reflector design 110c. For example, the light source, e.g., side-emitting LED or other source, may be aligned so as to point e.g., about 180 deg away from the direction of the outcoupling area, 112, 112a, 112b, 112c (shortest path).

Accordingly, the distance between the light source 104, or light sources 104 in a typical scenario of several light sources utilized, and associated outcoupling area(s) 112, 112a, 112b, 112c may be kept short and reduced from more conventional solutions as the respective optical distance defined by a path the light emitted by the light source(s) 104 actually take prior to outcoupling 112 is increased by roughly two times the distance D illustrated in the figure, i.e. the distance between the reflector design 110c and each concerned light source 104. This turns into smaller applicable multilayer structures and/or larger outcoupling area(s) 112, 112a, 112b, 112c obtainable with decent light mixing characteristics, depending on the preference set for the application as being understood by a person skilled in the art.

The reflectance of the reflector design 110 is preferably at least locally about 75%, more preferably at least about 90%, and most preferably at least about 95% at selected, optionally essentially all visible, wavelengths of light such at least part of the wavelengths emitted by the source(s) 104.

To achieve e.g., sufficient reflectivity, the reflector design 110 or some other optically functional element included in the structure at least locally preferably comprises at least one element selected from the group consisting of:

electrically conductive material, such aluminum, silver, gold, zinc, copper, or beryllium;

metal, optionally metal particles, further optionally provided upon or within the substrate film or further film or a further film or layer included in the structure;

a plurality of stacked, superimposed material layers of at least two mutually different refractive indexes, optionally defining a Bragg mirror;

thin-film coating, optionally PVD (physical vapor deposition) coating; and (reflective) preferably printable ink or paint. Accordingly, through utilization of conductive materials such as metals in one or more layers of the reflector design 110, a so-called skin depth of the reflector design 110 and the whole underlying structure can be kept small and thereby, reflection efficiency high. Conductive materials and metals may be provided e.g. in a film, paint, ink, or extrusion (e.g., metal particles in a host material such as plastics) process. In principle, any practical metallization procedure may be applied to provide the metal(s).

Alternatively or additionally, a plurality of stacked layers (potentially even tens or hundreds of layers) may be applied to establish a jointly effective, preferably integral, reflective structure, such as a Bragg mirror. In such structures, layers of different refractive indexes may alternate in a sequence. For example, two materials of different refractive index may be configured to alternate in a multilayer reflector stack constituting at least portion of the reflector design 110. At each interface between the two material layers a Fresnel reflection is advantageously created. When the optical path length difference between subsequent layers is half of the wavelength (i.e., each layer is quarter wavelength thick), the reflections interfere constructively (zero/360 deg phase shift between reflections). For example, plastic polymer materials may be utilized in the multilayer reflector stack, such as e.g. PMMA and PC or PS. The stacked integral multilayer element may in some embodiments also include substrate film 102 and/or other film(s) or generally layer(s) or feature(s), such as item(s) 114, 116, the subject being discussed further hereinbelow in more detail.

The stack included in the reflector design 110 may be realized as an optionally ready-made multilayer film. Alternatively, several, optionally stacked, material layers of the reflector design 110 may be produced by a selected coating technique (e.g., PVD or electroplating on plastics) on a substrate, such as the substrate film 102. Alternatively or additionally, e.g. (multiple) co-extrusion process may be applied.

Item 114 briefly refers to at least one further, optionally additively produced by printing, for example, material layer, optionally stacked and further optionally in contact with the reflector design 110. The at least one further material layer 114 preferably has a lower refractive index than the layer 108. For example, the layer 114 could comprise PMMA when the layer 108 is of PC.

The at least one further material layer 114 and the layer 108 may be optically connected, optionally also physically adjacent, so as to redirect at least part of the light emitted by the light source propagated within the plastic layer 108 and incident upon the at least one further material layer 114 back towards and into the plastic layer by total internal reflection (TIR) at their interface. In general, and e.g., in cases wherein the reflector design 110 is stacked with and located e.g., behind the interface of layers 108, 114 on the optical path, it 110 may effectively cooperate with the interface and reflect e.g. the remaining light that has passed through the interface e.g. at angles lower than a related critical angle and is thus incident on the reflector design 110 behind.

At least a layer or other portion of the reflector design 110, a layer of the at least one further material layer 114, and the layer 108 may thus be at least locally superimposed in terms of their materials so that the material of the layer of the at least one further material layer 114 is stacked between the materials of the reflector design 110 and the layer 108.

Generally, at least portion of the reflector design 110, 110a, 110b, 110c and the at least one further material layer 114 may mutually reside on the same, opposite, or both/several sides 108a, 108b of the layer 108.

The at least one further material layer 114 may optionally comprise or consist of e.g., optically clear adhesive (OCA) or primer.

Generally, utilizing e.g., patterned selective low(er) refractive index materials e.g., in layer 114 or elsewhere, light propagation in the structure may effectively, both technically and cost-wise, controlled. For instance, with large structures having one or more light sources 104, selectively producing light guiding and light guiding enhancing such as reflective (border) structures may turn out advantageous. Light guiding structures such as item(s) 108, 110, 114, 116 can be constructed e.g., sector-wise having different optical properties and e.g. lengths or generally dimensions.

In some embodiments, an integrated multilayer construction, such as a multilayer film 102a, may be included in the structure 100 as a prefabricated or in situ fabricated element.

The multilayer film 102a may include a plurality of, e.g. two, stacked and attached, optionally co-extruded, layers one of which may be or establish the substrate film 102 or similar layer for hosting the light source 104 as well as the circuit design 106 and potential additional electronics or other elements, while at least one other layer may be at least one layer of item 114 and/or of the reflector design 110, 110a (which may itself be a multilayer material stack as discussed hereinbefore), for example, among other options.

In some embodiments, an intermediate layer 116 may be provided in the structure, e.g. between the layer 108 and a layer of the at least one further material layer 114 (if present), and/or between the layer 108 and reflector design 110, 110b, on the first side 108a of the layer 108.

The intermediate layer 116, embodied e.g., as a film, may also act as a substrate (surface) for various elements such as electronic components incl. light sources. The intermediate layer 116 may comprise optically transmissive material optionally same as that of the layer 108 or has at least a similar refractive index therewith. Previous considerations provided herein regarding the substrate film 102, may also be generally applied to the intermediate layer 116 as being appreciated by a person skilled in the art.

The intermediate layer 116 and the layer of said at least one further material layer 114 and/or at least one layer of the reflector design 110, 110b may further be constituents of a multilayer construction such as multilayer film 116a, further optionally being a co-extruded multilayer film.

Items 120, 122 refers to one or more elements such as material layers optionally at or at least close (preferably within one or two material layers) to any of the exterior surfaces of the structure on either side or both sides 108a, 108b of the layer 108. They 120, 122 may include films, coatings, prints, plastic materials, natural materials (leather, etc. as listed e.g., in connection with applicable substrate film/film materials hereinbefore). The item(s) 120, 122 may host other features (e.g., electronic components) or layers, and be thus also considered substrate(s) depending on the embodiment. Preferably the items 120, 122 are at least translucent in places, comprise optionally filled (with at least translucent material) (through-)holes or cover only limited area(s) to enable light outcoupling from the structure. Different lamination, printing, coating, molding, or extrusion methods may be utilized for providing any of the items 120, 122, for example.

Item 118 refers to one or more outcoupling elements the structure may comprise e.g., either as originally separate or integral, if not even monolithic, with any of the remaining elements such as the reflector design 110 or various (other) material layers.

For instance, the reflector design 110, such as a layer or other portion thereof, or a further element or specifically layer of the structure having light emitted by source 104 incident thereon may host, be or define a locally treated, preferably mechanically, chemically or electrically treated, optionally deformed, such as stretched, portion, such as a material stack portion (locally two or more, optionally all layers of the stack deformed) or a material layer portion, with respectively altered reflective properties for light redirection and outcoupling (altered implying reduced reflection, for instance), optionally through the layer 108 or more directly without (anymore) going through the layer 108. As a hands-on example, such outcoupling element 118 could be provided to the reflector design 110 (to one or more associated material layers) on one side of the layer 108, e.g., side 108b so that at least portion of the light incident on the element 118 is then outcoupled either via the surface 108a of the layer 108 after having passed through the layer 108 or via the bottom (as oriented in the figure) surface of the structure potentially without entering the layer 108 anymore.

As alluded to hereinbefore, instead of or in addition to the reflector design 110, other element of the structure such as the layer 108 may locally host or define e.g. a surface feature or a surface pattern constituting at least portion of an outcoupling element 118, optionally comprising a roughened or otherwise deformed area, for outcoupling light that is internally incident thereon.

Any of the elements 118 may be scattering/diffusing or collimating, for example.

Figure 5:
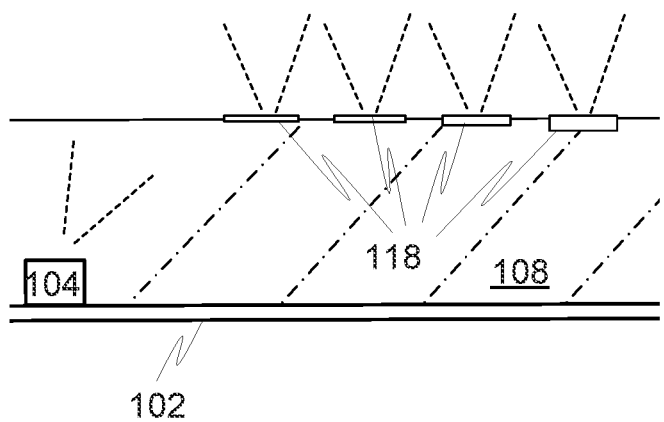
FIG. 5 illustrates an embodiment where outcoupling elements have arranged on the plastic layer.

In a cross-sectional sketch of FIG. 5, at 500, a plurality of outcoupling elements 118 have been illustrated, comprising a number of preferably printed, optionally scattering, elements of spatially mutually varying density of incidence and/or dimensions, preferably including at least thickness, upon the layer 108.

Accordingly, in the illustrated and other use scenarios and embodiments, the density of incidence, thickness and/or one or more other dimensions of the outcoupling elements 118 may be configured to increase with distance from the light source(s) 104 to respectively enhance outcoupling performance with distance (e.g., at least relatively, in contrast to outcoupling performance of a closer element 118), one or more of said number of outcoupling elements optionally comprising fluorescent, phosphorescent, thermochromic or photochromic material.

Figure 13:
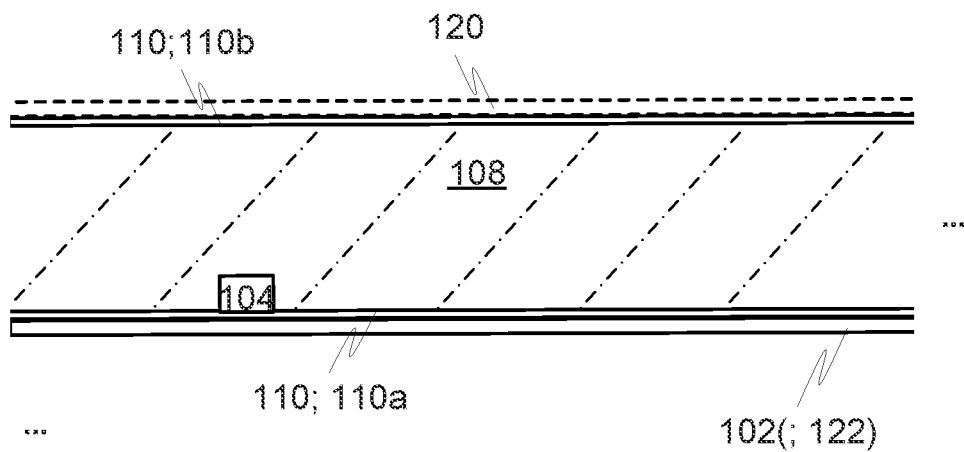
FIG. 13 illustrates an alternative configuration of material layers of the multilayer structure, wherein the reflector design, such as material layer(s) thereof, may at least locally neighbor the plastic layer.

For the sake of completeness and to facilitate understanding different configurations the embodiments of the present invention may in each application adopt, FIG. 13 illustrates, at 1300, an alternative arrangement of material layers included in the structure. In particular, at least portions of the reflector design 110 such as one or more layer(s) thereof if not the design as a whole, may at least locally neighbor the layer 108 and/or be stacked between the layer 108 and e.g., film 102, whereas in the sketch of e.g., FIG. 1 the reflector design 110 was illustrated behind the film 102 from the perspective of the layer 108, i.e. closer to or at the exterior or outer surface of the structure.

Yet, in some embodiments at least a portion of the reflector design 110 may be positioned adjacent the substrate film 102 so as to enable light to incouple from the light source 104 into the substrate film 102 and subsequently propagate within the substrate film 102 by reflection (mirror, TIR, etc. depending on the neighbouring elements or specifically, layers) until incident on an outcoupling area 112 or element 118 allowing the light then to proceed outside the substrate film 102 and optionally through the plastic layer 108 either into further layer(s) and/or the environment. The concerned outcoupling area 112 or element 118 may in also this scenario comprise or consist of a deformed substrate or generally material portion, a coating, or a printed portion, for instance.

Figure 4:
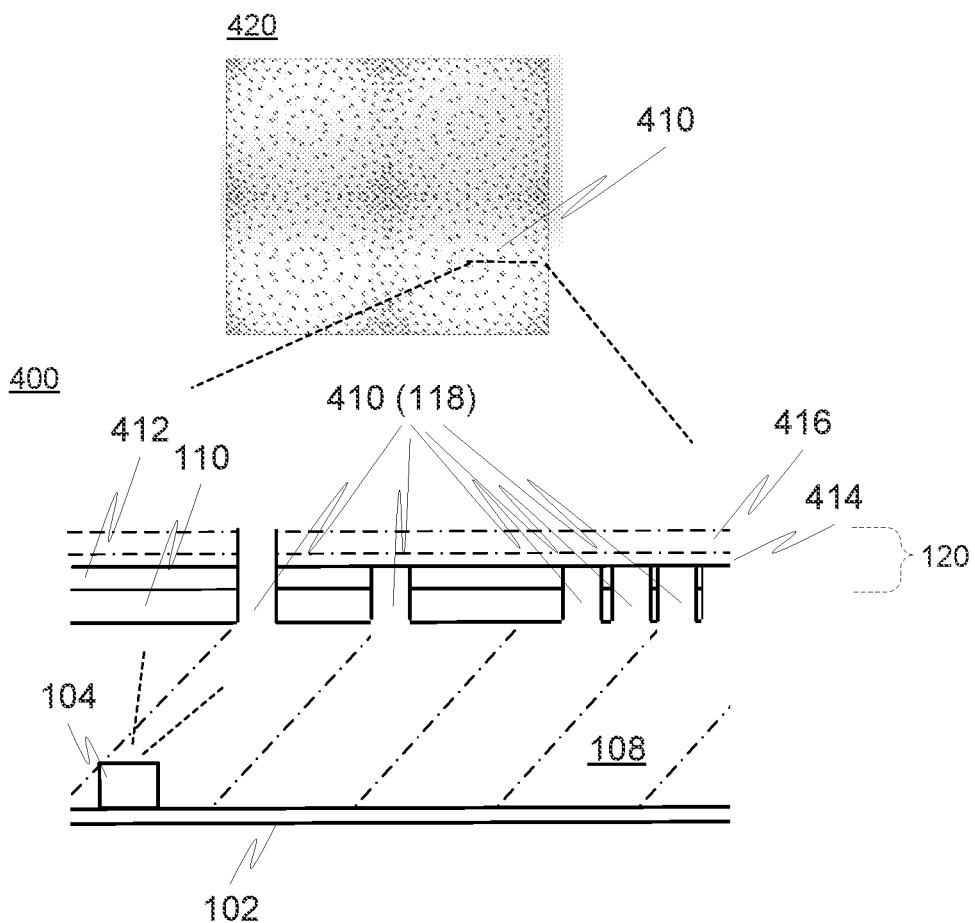
FIG. 4 depicts possible provision of holes in the reflector design and potential configuration of further layers in the optical path for light outcoupling from the structure.

FIG. 4 illustrates, at 400, via a cross-sectional sketch, an embodiment wherein a number of holes 410 have been configured in the reflector design 110 to enable or facilitate light outcoupling through the reflector design 110 and optionally out from the overall structure, still naturally depending on the optical transmission characteristics of subsequent, upper (in the figure) layer(s) and element(s) in the optical path. Accordingly, the figure also depicts potential configuration of a number of further layers in the optical path for light outcoupling from the structure, wherein one or more of the further layers or elements 412, 414, 416 may also be provided, at least in places, with holes, which may in turn be configured as stacked or laterally aligned with the holes of other layers such as the holes 410 in the reflector design 110. As shown in the fig. for illustrative purposes, on the left, a hole 410 goes through all the layers upon the layer 108, whereas the holes 410 on the right are only present in items 110, 412.

One or more holes 410 in any of the items 110, 412, 414, 416 may be left free from material (may thus accommodate e.g., air during the manufacturing process of the multilayer structure) or be filled with suitable material such as optically at least translucent if not transparent material, optionally e.g. glass or plastics such as thermoplastic material. The fill material may be optically diffusive, for instance.

The configuration of holes 410 in the reflector design 110 and optionally further layers 412, 414, 416 may be made regular or non-regular in terms of selected characteristics such as density of incidence, shape or the size (e.g., diameter). The density of incidence and/or size of holes preferably increases with distance from the light source 104 in cases, where the distance from the source-induced losses are to be compensated in the outcoupled light in favour of more uniform illumination, for instance. At 420, a top/plane view of the reflector design 110 and potential further layer(s) thereon is depicted to visualize how the configuration of associated holes 410 may be adapted spatially e.g., responsive to the distance from the source(s) 104.

Any of the holes 410 may have been created in any of the items 110, 412, 414, 416 through perforation or otherwise subtractively including removal of material from the items in favour of the holes 410 created. Also, an additive process may be applied to produce a layer with a number of holes, with reference to molding and printing technologies, for example. The holes may have e.g., 50-200 um diameter and/or round shape, but also other sizes and shapes are technically feasible.

The holes 410 may be through-holes but also the use of one or more non-through holes is feasible if the remaining material at the location of a hole implements a translucent, transmissive layer, for instance, which may anyway require sticking to somewhat low material thickness locally as being easily comprehended by a person skilled in the art.

Figure 14:
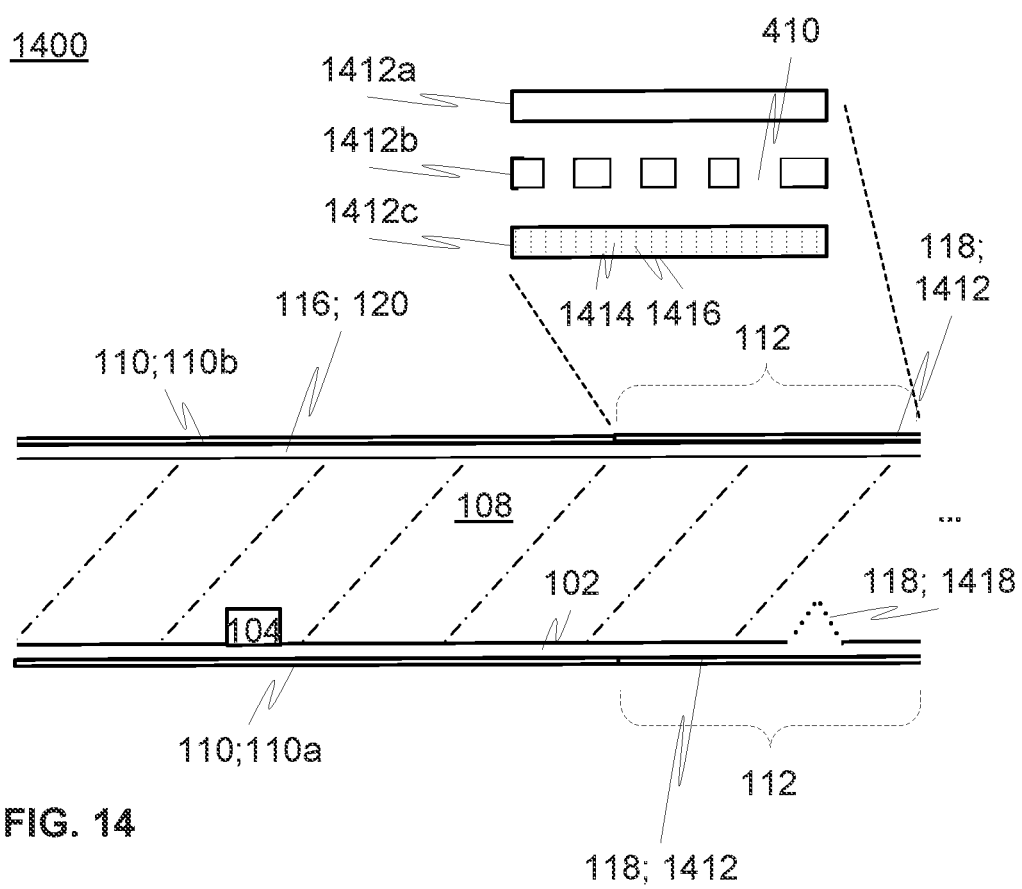
FIG. 14 illustrates different options and configurations for light outcoupling.

A hole or multiple holes 410 could also be generally considered in many use scenarios as an embodiment, or at least part of an embodiment, of outcoupling elements 118 further discussed e.g., in connection with the description of FIG. 14 and hereinelsewhere. Thus, instead of in addition to holes, other features breaking/deforming or otherwise locally altering a target element such as a target layer could be utilized, still optionally following the principles, mutatis mutandis, set forth above regarding the holes.

Item 412 refers to a preferably opaque masking element or layer, which may be, for instance, printed (e.g., white print), co-prepared such as co-extruded, coated, otherwise prepared or laminated (e.g., a film laminated optionally using pressure, adhesive, etc.) on other element or layer, such as the reflector design 110.

Item 414 refers to a diffuser element or diffuser layer, which may be, for instance, printed, co-prepared such as co-extruded, coated, otherwise prepared or laminated (e.g., a film laminated optionally using pressure, adhesive, etc.) on other element or layer, such as the reflector design 110.

Item 416 refers to at least one, at least locally translucent, if not transparent, element or layer, which may be, for instance, printed, co-prepared such as co-extruded, coated, otherwise prepared or laminated (e.g., a film, which may be optionally laminated using pressure, adhesive, etc.) on other element or layer, such as the reflector design 110.

The item 416 may have protective function and/or indicative function (it may contain graphical indicators such as symbols optionally produced by printing) in addition to aesthetic or look-and-feel type role.

As being appreciated by a person skilled in the art, any of the afore-discussed items 412, 414, 416 may be provided in the structure as a ready-made element, prepared in situ thereon, or installed together with one or more of the other items 412, 414, 416 added. Items 412, 414, and/or 416 may further establish at least portion of item 120 or 122 previously discussed.

Figure 6:
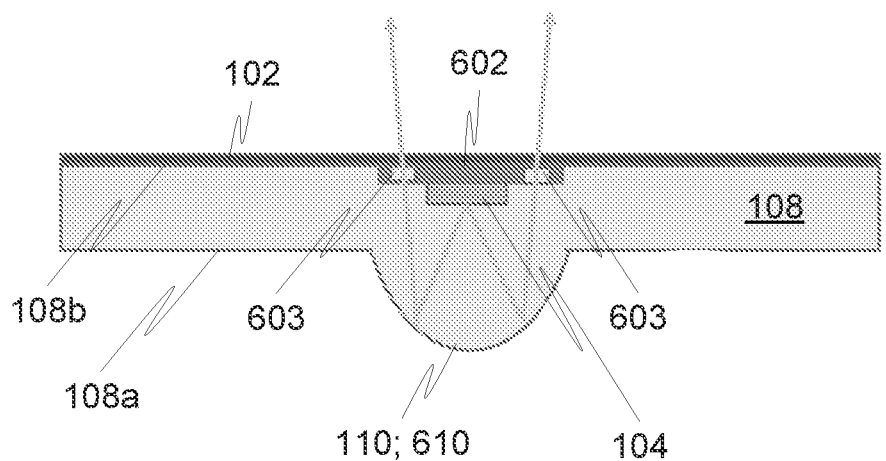
FIG. 6 illustrates an embodiment incorporating an embedded circuit board for hosting at least one light source and potentially further electronics as well as a reflector design including a parabolic reflector surface.

FIG. 6 illustrates, at 600, an embodiment incorporating an embedded circuit board 602 for hosting the light source 104 and potentially further electronics, as well as a reflector design 110 including a parabolic reflector surface 610. In some embodiments, the circuit board 602 could be left out and the light source 104 provided upon the substrate film 102 directly or via some other intermediate entity such as material layer.

By providing at least the light source 104 on a circuit board 602, a lighting module containing at least these two may be conveniently provided upon the substrate film 102, attached using e.g., conductive and/or non-conductive adhesive(s), and preferably electrically connected to the circuit design 106 thereon using e.g., conductive ink or adhesive. The circuitry on the board 602 may include a local circuit design or sub-design with e.g. conductive traces or pads for connecting components such as light source(s) 104 with other components or elements, e.g. control or communication circuit, in a desired fashion at least locally on the board 602.

By utilizing the board 602, heat management of the remaining structure may be facilitated and the wattage of one or more light sources 104 and/or of some other high-power component included may be about 1 W or more, even significantly more, for example. Optionally, there may be a plurality of light sources of mutually similar or different characteristics (wavelength/color, power, emission direction, beam width, technology, etc.) on the board 602.

The circuit board 602 may comprise at least one element selected from the group consisting of: a flexible film or sheet, a rigid sheet, rectangular sheet or film, rounded or essentially circular sheet or film, FR4 based circuit board, metal core circuit board, plastic substrate, molded such as injection molded plastic substrate, metal substrate such as sheet metal substrate optionally having an electrically insulated layer at least selectively provided thereon, and a ceramic circuit board.

In various embodiments, the circuit board 602 or e.g., the substrate film 102 or some other substrate layer in the structure may host various electrical and/or other elements, such as series resistor, thermistor, white solder mask, trace, antenna, sensor, electrode such as a capacitive sensing electrode, contact pad, integrated circuit, controller, processor, memory, transceiver, driver circuit, optionally optically clear glob top or other conformal coating, and via such as electrical, fluidic and/or thermal via.

Generally, the circuit board 602 may be planar and preferably round if not essentially circular or elliptical by its general shape. The dimensions, shapes and thickness of the circuit may vary depending on the use case. Therefore, e.g., rectangular shape is possible as well. Thickness may be a fraction or portion of a millimeter (e.g., between about 0.2 and about 0.6 mm), a millimeter, few millimeters, or more, for example. Yet, the diameter may be few millimeters, about one centimetre, or few centimeters among other options. Castellations may be provided at the edges for convenient edge connections.

E.g., in case the circuit board 602 is not itself made from translucent or transparent material, the circuit board 602 may at least be provided with a number of holes 603 to enable the light emitted by the source(s) 104 and reflected from the parabolic reflector 610 to conveniently pass through towards the environment and e.g., potential user 113 therein without undesired issues such as shadows in the obtained distribution of light. Naturally, the concept of utilizing a preferably hole-provided circuit board for accommodating the light source 104 and/or other electronics or element(s) is feasible also in embodiments not comprising the parabolic reflector 610. The holes 603 may be filled with optically transmissive, at least translucent if not transparent material, e.g. by the material of the layer 108 upon producing it by molding, for example, which may optionally further secure the board 602. In the shown scenario, naturally the substrate film 102 and potential layer(s) or other element(s) thereon shall preferably also be at least translucent at least in places to enable light transmission therethrough.

In any case, the reflector design 110 may at least locally define a collimating reflector surface 610, optionally essentially a parabolic reflector, preferably on a side 108*a* of the layer 108 opposite to a side 108*b* facing the first side of the substrate film 102 hosting the light source(s) 104. The surface 610 or the reflector design 110 in general may be obtained, for example, by a selected coating method applied on a host surface as discussed hereinelsewhere. The parabolic host protrusion or "bumb" surface shape on surface 108*a* in the layer 108 may in turn be obtained during molding and/or printing of the layer 108 by utilizing a suitable mold shape or afterwards by a selected subtractive or additive processing, for example. The opposite surface 108*b* may be kept smooth, which may turn out beneficial in applications requiring a flat film 102 surface or e.g., overall exterior surface facing the (use) environment of the structure, for example. The associated motives may vary but include e.g., surface treatments, functionalities (e.g., touch sensing) or aesthetics benefiting from or requiring a substantially flat target.

Figure 7:
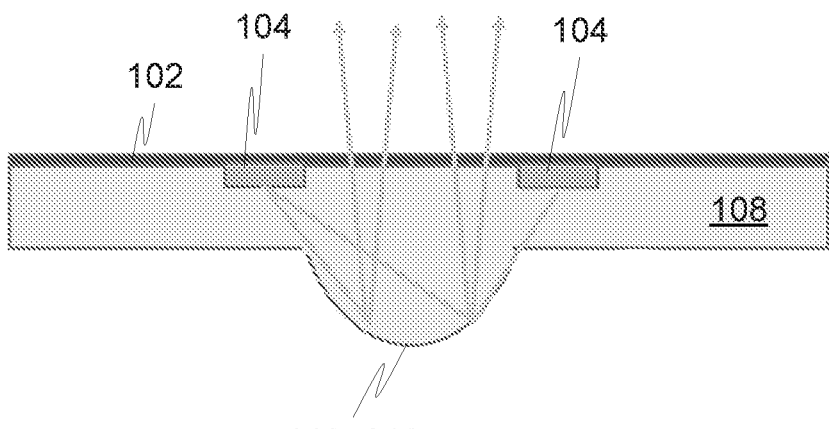
FIG. 7 illustrates another potential embodiment involving a parabolic reflector surface and shape.

FIG. 7 illustrates, at 700, another potential embodiment involving a parabolic reflector surface and shape. Light source(s) 104 have been this time off-centered from the optical axis or axis of symmetry of the reflector shape and thus located aside from a related light aperture, and again, e.g. undesired shadowing may be avoided or at least reduced on the illuminated surface upon film 102. Optionally, circuit board(s) 602 could also be utilized in this scenario (not illustrated).

Figure 8:
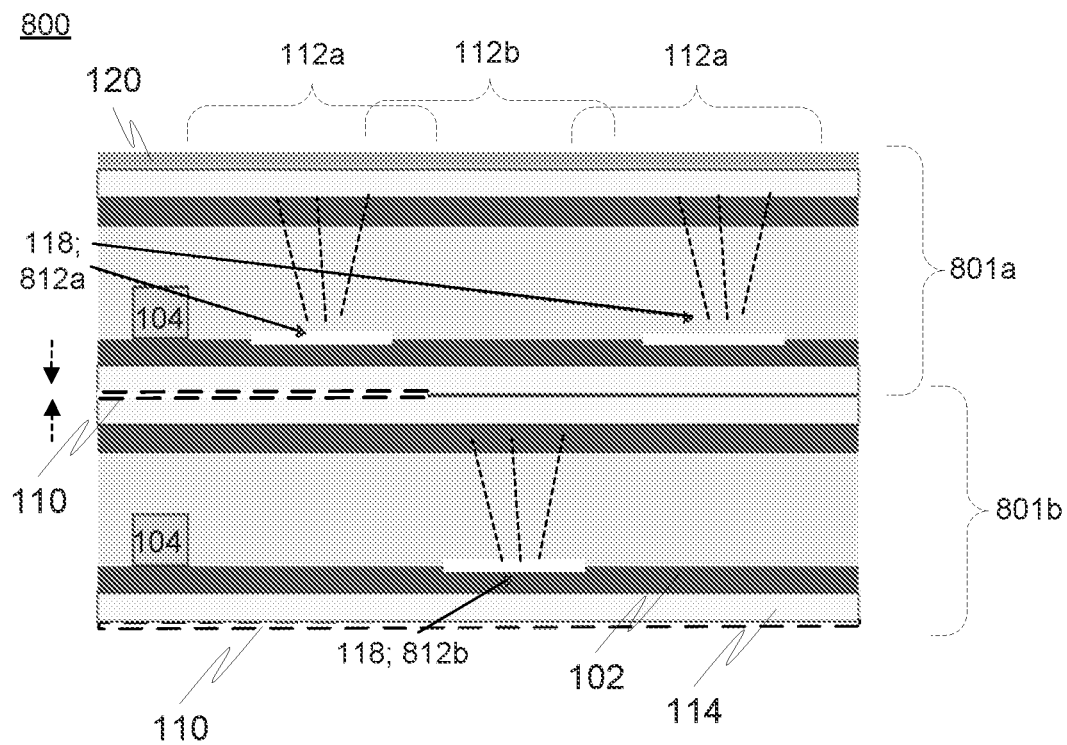
FIG. 8 illustrates an embodiment of an illumination ensemble including a plurality of multilayer structures discussed herein.

FIG. 8 illustrates, at 800, an embodiment of an illumination ensemble including a plurality of mutually different multilayer structures generally discussed herein. Two or more of such structures 801*a*, 801*b* may be prepared, stacked and preferably attached (adhesive, mechanical fixing elements or other methods of bonding may be used here) together to establish also functional ensemble. Alternatively, the ensemble 800 could be constructed otherwise, e.g., layer-wise. The ensemble 800 may be configured to out-couple light from each of the structures 801*a*, 801*b* via their individual, optionally at least partially non-overlapping, outcoupling areas 112*a*, 112*b* on one or more surfaces of the ensemble and/or illuminated outcoupling elements 812*a*, 812*b* within and/or on the surface of the ensemble. The outcoupling areas 112*a*, 112*b* may be associated with characterizing visuals such as e.g. printed or mask-based graphics provided on any of the illuminated surface layer(s) 120, whereupon independently controlling the light output from the structures 801*a*, 801*b* and optionally further from the included light sources 104 in case one or more of the structures 801*a*, 801*b* comprises several independently controllable sources 104, may be utilized to selectively illuminate the visuals and generally render them visible for external perception. Accordingly, functionally complex illuminated/illumination structures may be constructed from simpler, combinable constituent assemblies, which are mutually different or similar in terms of structure, dimensions, and/or included features or related functionalities.

Figure 9:
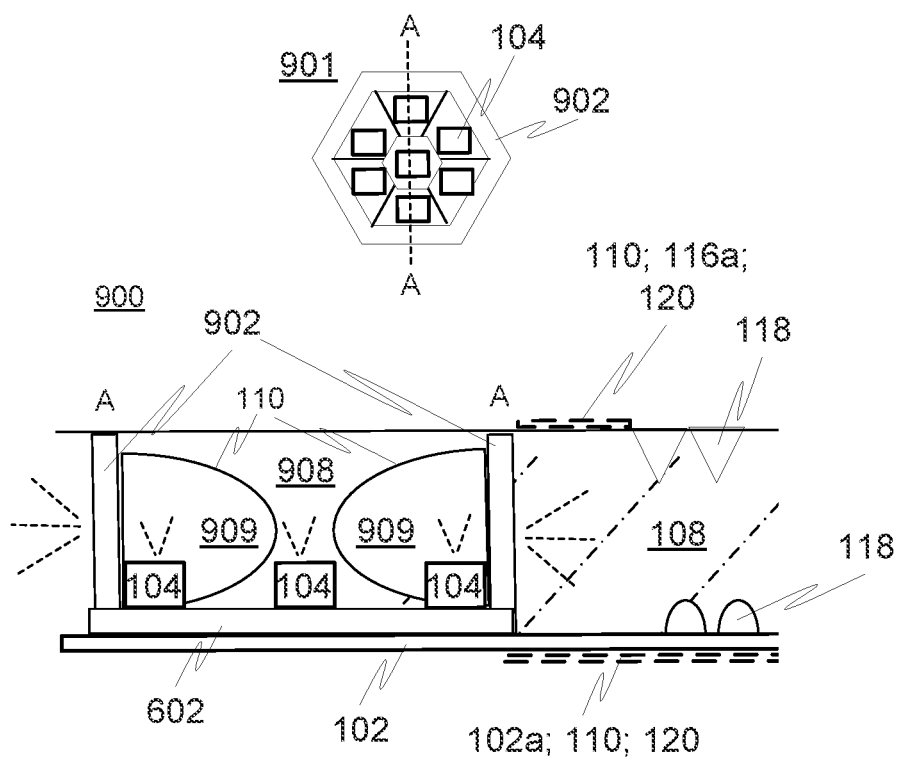
FIG. 9 illustrates an embodiment wherein a lighting module is included in the structure, comprising at least one light source on a circuit board further potentially hosting additional electronics or optics.

FIG. 9 illustrates, at 900 (cross-sectional view, see A-A cut line) and 901 (top/planar extract view) an embodiment wherein a lighting or illumination module is included in the structure, comprising at least one light source 104 (in the shown example, six) on a circuit board 602 (on the substrate film 102) further potentially hosting additional electronics or optics.

The circuit board 602 may optionally further host optical element(s) such as a lightguide 908 comprising optically transmissive (transparent or at least translucent) material such as thermoplastic material(s) discussed hereinelsewhere, covering one or more light sources 104. Yet, a wall structure 902 preferably at least in places comprising optically transmissive and optionally clear material has been advantageously arranged at the periphery of the circuit board 602. Further, there may be an air gap or fill 909 (again, preferably comprising transparent or at least transparent material) preferably between the wall structure 902 and the lightguide 908. The circuit board 602 may further comprise a number of optionally filled (translucent/transparent fill) holes 603 for enabling light transmission therethrough as deliberated hereinbefore.

Figure 11:
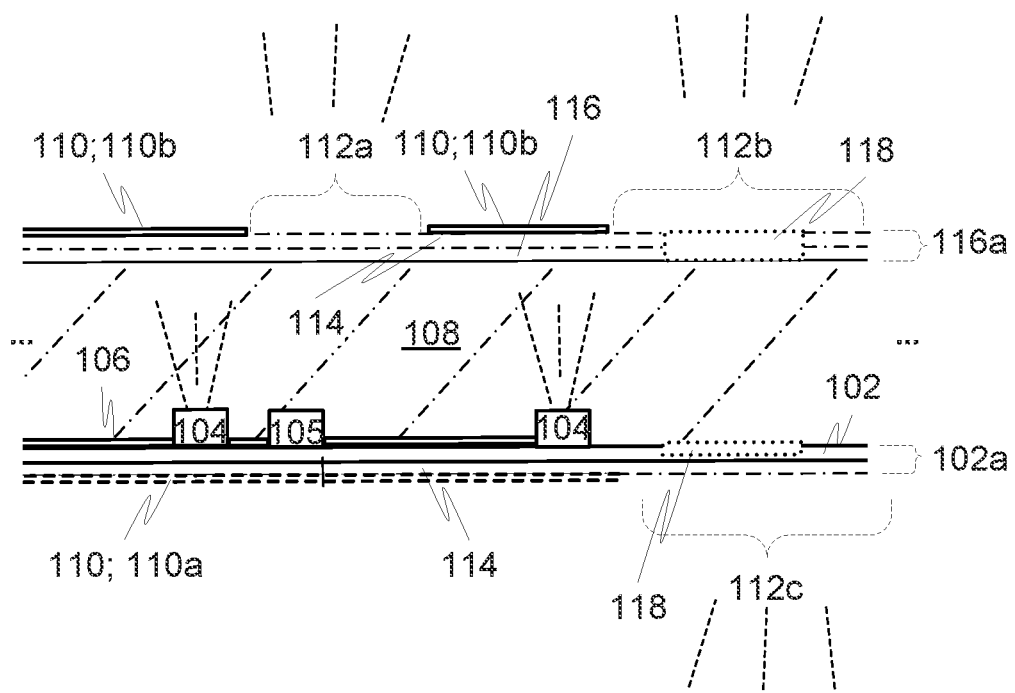
FIG. 11 illustrates an embodiment with multiple light sources and related control circuitry included in the structure.

FIG. 11 illustrates, at 1100, an embodiment with multiple light sources 104 and other circuitry 105 such as related control circuitry included in the structure.

The control circuitry 105, such as driver circuitry, controller chip such as a microcontroller, microprocessor, (other) integrated circuit or the like, may optionally comprise elements at least partially integral with any of the light sources 104 instead of or in addition to being separate from while still electrically connected, e.g., via circuit design 106, with them 104. Preferably, the circuitry 105 is configured to dynamically and/or independently adjust e.g., the intensity and/or other characteristics (e.g. color distribution when applicable) of light emission of each of at least two of the light sources 104. However, also joint control may be additionally or alternatively enabled for two or more light sources 104. Yet, the circuitry 105 may at least functionally connected to external circuitry via wiring and connector(s), for instance, power data and/or power transfer.

For a light source 104, such as a LED, e.g. PWM (pulse width modulation) or current control may be utilized for the purpose. Control circuitry 105 can be included in the structure also in cases where only single light source 104 is present.

Figure 12:
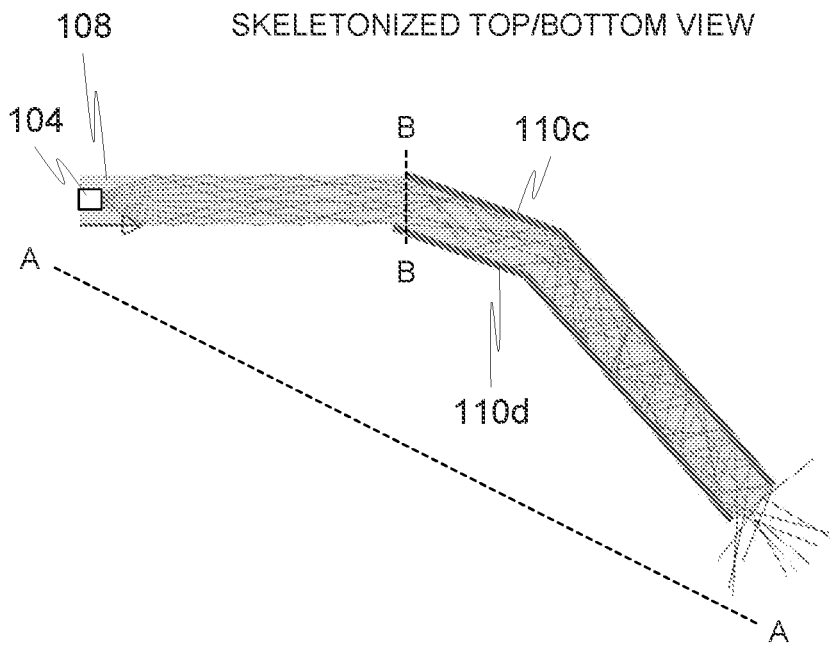
FIG. 12 illustrates an embodiment including a bend in the plastic layer.
Figure 12:
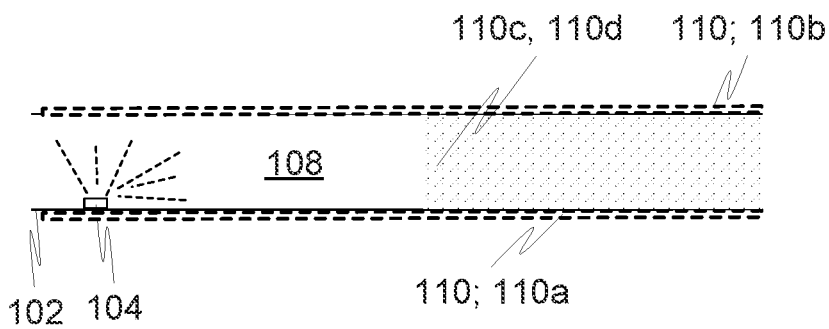
Figure 12:
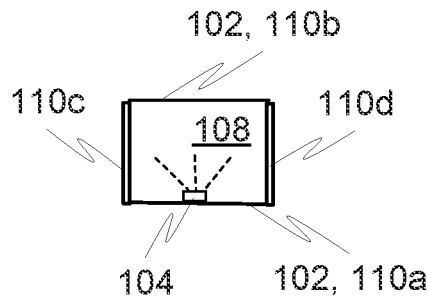

FIG. 12 illustrates (at 1200 via a cross-sectional top view, at 1202 skeletonized view in A-A direction, at 1204 cross-sectional view along B-B) an embodiment including a bend in the layer 108.

At least the layer 108 indeed defines a bend, optionally having a bend angle of about 10 degrees or more, potentially even about 30 or 45 degrees, or more, and at least a portion of the reflector design 110 is located essentially at an outer and/or inner perimeter thereof on the layer 108. Reflective portions 110*a*, 110*b*, 110*c*, 110*d* have been thus illustrated in the figure accordingly.

By utilizing the reflector design 110, bends and other similar, more complicated shapes may be carried out in the layer 108 and general structure without essentially losing optical efficiency. In addition to the reflector design 110, TIR type interfaces and related enabling elements or layers (e.g., layer 114) may be included in the structure to maximize lightguiding efficiency as more thoroughly discussed hereinelsewhere.

FIG. 14 further illustrates, at 1400, different options and configurations for light outcoupling in connection with various embodiments of the present invention, some of which have also been contemplated in connection with the description of other Figs appended herewith.

Accordingly, a number of outcoupling elements 118 such as particular shapes and/or material layers for controlling or enhancing outcoupling may be provided e.g., in the optical path from the light source 104 towards the exterior of the structure and e.g., as embedded, at the surface of, or subsequent (optical path-wise) to the layer 108.

Item 1412 refers to a type of an outcoupling element 118 comprising a material layer and/or other outcoupling feature being part of the reflector design 110 or adjacent it in the structure, for example, but comprising features for enhancing light outcoupling.

The outcoupling elements 118, incl. 1412, may therefore comprise:

a locally dented or protruding surface such as the surface of the layer 108 optionally defining one or more e.g., prismatic dent or protrusion shapes 1418;

an element or specifically, a layer 1412*a* of optically at least translucent if not transparent material with a refractive index lower than of optically subsequent, adjacent material such as air, and/or a perforated, holey or otherwise locally thinned or through-cut layer of opaque material;

an element or specifically, a layer 1412*b* with holes (no fill, or translucent/transparent fill) in the carrier material (may be opaque);

an element or specifically, a layer 1412*c* of alternating higher 1414 and lower 1416 refractive index materials; and adhesive or adhesion promoting primer, preferably substantially being of optically transparent or at least translucent type (may act as cladding material).

Figure 15:
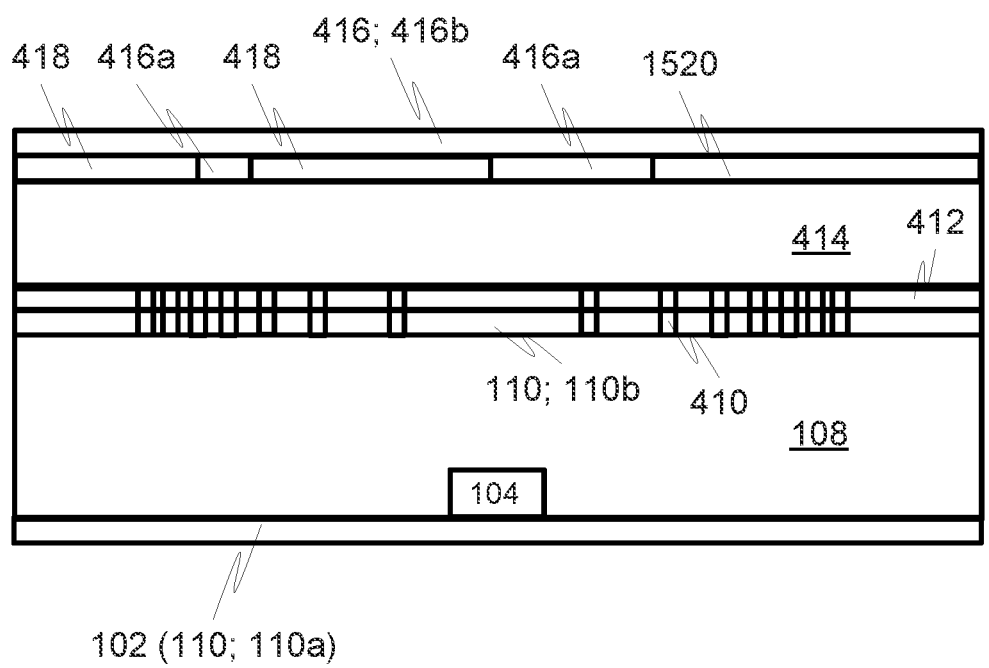
FIG. 15 illustrates an embodiment of the multilayer structure further incorporating additional functionality such as touch or gesture sensing.

FIG. 15 illustrates, at 1500, an embodiment of the multilayer structure (or ensemble of structures), further incorporating supplementary functionality such as touch or gesture sensing (optionally contactless) in addition to illumination. The supplementary functionality may be provided, e.g., as an integral construction or layer-wise, by additional layers and other elements arranged on the multilayer structure containing the light source(s) 104 and further optical features.

For instance, a diffuser element 414 such as a film or coating may be provided.

Preferably at least translucent or substantially transparent, essentially planar electrode 418 may be provided, optionally printed on the diffuser 414 or other adjacent element or layer, e.g. 416*b*. The electrode 418 may be electrically or electromagnetically connected to other circuitry 105 such as driving or sensing circuitry also positioned in the structure and/or external thereto. Electrical wiring or wireless connectivity may be applied for the purpose.

As mentioned hereinbefore, item 416 refers to at least one, at least locally translucent, if not transparent, element or layer, which may be, for instance, printed, co-prepared such as co-extruded, coated, otherwise prepared or laminated (e.g., a film laminated optionally using pressure, adhesive, etc.) on other element or layer, such as the reflector design 110. For example, item 416 may thereby comprise e.g., printed graphics 416*a*, optionally laterally adjacent the electrode 418 and/or a protective exterior surface element 416*b* of optionally translucent, non-transparent type, which still preferably enables externally perceivable backlighting (i.e., not fully opaques). Item 416 may comprise (perforated, thin(ned) or otherwise treated, configured, or selected to enable at least local translucency/transparency) plastics, metal or wood, leather, or other biomaterials, inks, fabric, etc.

Figure 10:
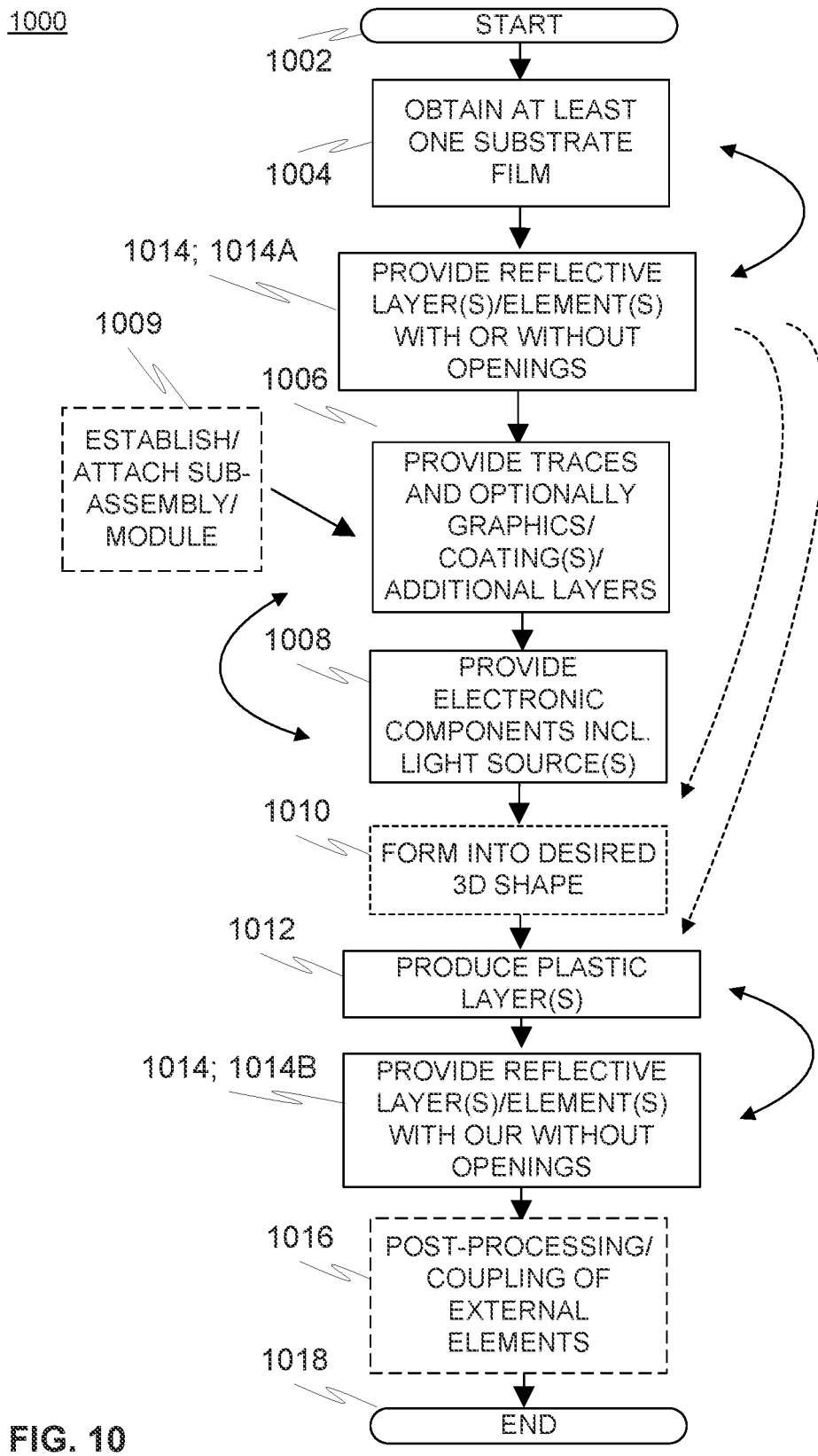
FIG. 10 is a flow diagram of an embodiment of a method in accordance with the present invention.

FIG. 10 shows, at 1000, a flow diagram of an embodiment of a method for manufacturing an integrated optically functional multilayer structure in accordance with the present invention. As applicable manufacturing processes and related characteristics regarding possible constituent elements and materials of various embodiments of the structure have already been discussed also hereinbefore, these discussions are not unnecessarily repeated here in favour of clarity of the overall, already lengthy method description. However, a person skilled in the art will appreciate the fact that they can revert to the previous paragraphs for finding valuable details also with respect to applicable manufacturing methods and considerations, while in terms of structural or functional details potentially included in the multilayer structure, the same applies also in reverse direction.

At the beginning of the method for manufacturing the multilayer structure, a start-up phase 1002 may be executed. During the start-up, the necessary preparatory tasks such as material, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding, IMD (in-mold decoration), lamination, bonding, (thermo)forming, electronics assembly, cutting, drilling, perforation, printing and/or measurement such as desired optical measurements -providing equipment, among others, may be thus ramped up to operational status at this stage.

At 1004, at least one, preferably flexible, substrate film of plastics or other material for accommodating e.g., light source(s) and potentially other electronics is obtained. The substrate film may initially be substantially planar or e.g., curved. The substrate film may at least dominantly be of electrically substantially insulating material(s). A ready-made element, e.g., a roll or sheet of plastic film, may be acquired for use as the substrate material. In some embodiments the substrate film itself may be first produced in-house by molding using a mold or molding device or other methods from selected starting material(s). Optionally, the substrate film may be processed further at this stage. It may be, for example, provided with holes, notches, recesses, cuts, etc.

Item 1014 refers generally to the provision of the reflector design. As being understood by a person skilled in the art also based on the previous contemplations herein, the reflector design or portion(s) thereof may be provided, by installation or in situ manufacturing, at different method phases to the structure depending on, not just the configuration of the reflector design itself, but also on other elements and their configuration in the structure. Yet, as the reflector design or a portion of it may also be provided as ready-integrated with further elements such as films or generally material layers, in some embodiments item 1014 may be integrated with other items. For example, a combined element of e.g., multilayer type for implementing a substrate for electronics and reflective structure or layer(s) could be obtained already at 1004.

The curved arrows thereby indicate that the order of pointed method items may be reversed and/or the items integrated or further split, depending on the particular embodiment in question.

The reflector design and related material layer(s) may be generally provided by printing, coating, laminating or molding, for instance. Yet, the process may include formation of various features such as holes in the reflector material and potentially filling them with other materials, or provision of outcoupling elements as discussed in more detail hereinbefore. The reflector design may comprise one or more material layers, optionally comprising a stack of material layers and/or a layer of electrically conductive and/or metallic material, for example. Yet, the reflector design such as layer(s) thereof may include or be arranged with further elements such as openings (holes). The reflector design is configured to reflect, optionally dominantly specularly, the light emitted by at least one light source included in the structure to be manufactured and incident upon the reflector design, optionally and in most common use cases, towards a plastic layer 108 provided at item 1012.

At least portion of the reflector design, such as one or more layers, may be provided on the substrate film(s) prior to the provision of plastic layer, see item 1014A. Alternatively or additionally, at least portion of the reflector design could be provided subsequent to or upon arranging the plastic layer on the substrate film or between the substrate film and another film, potentially being a further substrate film to reside on the other side of the intermediate plastic layer 108 established, see item 1014B.

Yet, the shown two one-directional dotted arrows further indicate additional or alternative process-wise options for the provision of reflection design 1014, essentially between item 1008 and 1010, and/or between item 1010 and 1012, or in connection with any of the aforementioned three items.

At 1006, a number of electrically and optionally thermally conductive elements defining e.g., various conductor lines (traces), sensing elements such as electrodes, and/or contact areas such as pads to construct a circuit design are provided on one or more of the substrate film(s), preferably by one or more additive techniques of e.g., printed electronics technology or 3D printing. Accordingly, the circuit design may comprise several circuits or circuit sub-designs on different layers of the overall construction, optionally being connected via conductive wiring e.g., through intermediate layer(s) or via the edge of the structure. For example, screen, inkjet, flexographic, gravure or offset lithographic printing may be applied by a suitable printing device or devices for producing at least portion of the circuit design. In some cases, also subtractive or semi-additive processes may be utilized. Further actions cultivating the substrate film(s) involving e.g., printing or generally provision of graphics, visual indicators, optical elements such as masks or outcoupling elements, holes/fills, etc. thereon or thereat may take place here if not already executed e.g., at 1004.

In various embodiments the electrically and optionally thermally conductive elements (traces, pads, connection elements, electrodes, etc.) may include at least one material selected from the group consisting of: conductive ink, conductive nanoparticle ink, copper, steel, iron, tin, aluminium, silver, gold, platinum, conductive adhesive, carbon fibre, graphene, alloy, silver alloy, zinc, brass, titanium, solder, and any component thereof. The used conductive materials may be optically opaque, translucent and/or transparent at desired wavelengths, such as at least portion of visible light, so as to mask or let the radiation such as visible light to be reflected therefrom, absorbed therein or get through, for instance. This aspect has also been discussed elsewhere herein. As practical examples of feasible conductive material, e.g. Dupont™ ME602 or ME603 conductive ink may be utilized.

At 1008 further circuitry such as one or more typically ready-made components including electronic components such as various SMDs is attached to the contact areas on the film(s) e.g. by solder and/or adhesives. For example, light source(s) (e.g., LEDs) of selected technology and packaging as contemplated hereinbefore may be provided here as well as e.g., different elements of control and/or driving electronics, communication, sensing, connecting (e.g. connectors), hosting (circuit board(s), carrier(s), etc.) and/or power provision (e.g. battery) depending on the embodiment.

A suitable pick-and-place or other mounting device may be utilized for the purpose, for instance. Alternatively, or additionally, printed electronics technology may be applied to actually manufacture at least part of the components, such as OLEDs (organic LED), directly onto the film(s) in situ. Accordingly, the execution of items 1006, 1008 to provide the multilayer structure with desired circuitry may temporally overlap as being understood by a skilled person. Yet, the components prepared or installed herein may also include various optical elements such as lenses, reflectors, diffusers, masks, filters, etc.

Non-conductive and/or conductive adhesive may be utilized for securing the components. In some embodiments, mechanical securing is implemented or at least enhanced by non-conductive adhesive material whereas solder or other electrically highly conductive (but to lesser extent, adhesive type of) material is used for electrical connection.

Selected elements may be subjected to further processing such as encapsulation (see e.g., overcoat related comments provided hereinearlier).

Item 1009 specifically refers to preparation and attachment of one or more, at least partially pre-prepared, modules, such as the afore-discussed lighting module incorporating at least one light source 104 and e.g., circuit board 602, or other 'sub-assemblies', which may incorporate an initially separate, secondary substrate such as a circuit board provided with a local circuit design and electronics such as a number of light source(s), IC(s) and/or various other elements or components, such as optical or structural ones (e.g. wall structure, diffuser, lens, carrier elements, etc.), as being contemplated also hereinearlier in more detail.

At least part of the electronics and/or other elements of the final multilayer structure may be thus conveniently provided to the substrate film(s) via fully or partially pre-manufactured module(s) or sub-assembly/assemblies. Optionally, a concerned module or sub-assembly may be at least partially overmolded or generally covered by protective material such as plastic layer prior to attachment to the main substrate.

For example, adhesive, pressure and/or heat may be used for mechanical bonding of the module or sub-assembly with the primary (host) substrate. Solder, wiring, and conductive ink are examples of applicable options for providing the electrical and/or thermal connections between the elements of the module or sub-assembly and with the remaining electrical and/or thermal elements on the main substrate. Item 1205 could also be executed e.g., upon item 1204 or 1208. The shown position is therefore primarily exemplary only.

Still, the circuitry generally included in the multilayer structure, e.g. on a substrate film, may comprise at least one component or element selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, microprocessor, microcontroller, digital signal processor, signal processor, programmable logic chip, ASIC (application-specific integrated circuit), data storage element, and electronic sub-assembly.

In some embodiments, prior to or upon item 1012, the substrate film(s) optionally already containing electronics such as at least part of the circuit design and/or the light source or other circuitry, may be optionally formed 1010 using thermoforming or cold forming, for instance, to exhibit a desired shape such as at least locally a three-dimensional (essentially non-planar) shape. Applicable former device such as a thermoformer may be utilized for the purpose. Additionally or alternatively, at least some forming could take place after molding in case the already-established multilayer stack is designed to survive such processing.

At 1012, an optically transmissive plastic layer or generally layer 108 is produced at least upon the first side of the substrate film and preferably the light source(s) thereon, the plastic layer at least laterally surrounding or neighbouring (see e.g., FIG. 9), optionally also at least partially covering (e.g., FIG. 1), the light source(s).

Preferably the plastic layer or in some embodiments, multiple layers provided, preferably comprising thermoplastic or in some embodiments optionally thermoset layer(s), are manufactured through molding such as injection molding, upon the substrate(s). Desired portions may be left clear or cleared afterwards with mechanical or chemical processing, considering e.g., a cover portion of lighting module or other module intended to host replaceable or generally accessible (e.g., inspectable or reprogrammable) components. Such module may then also include a (re)movable cover part for providing access to the internals thereof.

The molded material(s) may be provided using several molding steps or shots, or via a single step, wherein the molded material may even optionally flow through a substrate film from one side thereof to the opposing side via a hole prepared therein or by penetrating through the substrate material itself (e.g. through a thinned/thinner portion), for example. The molding material(s) may be, and in many embodiments preferably are, at least dominantly electrically insulating. Adhesion promotion material may be utilized on the films neighbouring the molded plastics.

In practice, at least one substrate film already provided with a number of features such as circuitry incl. light source(s), module(s), further optical features, etc. may be used as an insert in an injection molding process applying at least one molding machine. In case two films are used, both of them may be inserted in their own mold halves so that the plastic layer is injected at least between them. Alternatively, the second film could be attached to an aggregate of the first film and plastic layer afterwards by suitable lamination technique utilizing e.g., adhesive in between.

Some optical elements contemplated hereinbefore such as a lens structure, optical outcoupling element, or a diffuser may be at least partially established during molding from the used (thermoplastic) material and/or any of the film inserts by proper mold shapes, for instance.

Instead of or in addition to molding, e.g. (3D) printing could be harnessed into producing the plastic layer.

Regarding the resulting overall thickness of the obtained stacked multilayer structure, the thickness depends e.g., on the used materials and related minimum material thicknesses providing the necessary strength in view of the manufacturing and subsequent use. These aspects are to be considered on case-by-case basis. For example, the overall thickness of the structure could be in the order of magnitude of about some millimeters as discussed hereinelsewhere, but considerably thicker or thinner embodiments are also feasible.

In some embodiments, material(s) other than plastics could be utilized in the layer 108, with reference to e.g., glass.

Item 1016 refers to a number of potential additional tasks such as post-processing and installation tasks. Further layers, single-layer or multilayer films, or generally additional features, may be added into the multilayer structure by molding, printing, lamination e..g,, by heat, adhesive, or pressure, or suitable coating (e.g. deposition) procedure, not forgetting other possible positioning or fixing techniques and subtractive technologies such as lasering. The layers may be of protective, indicative and/or aesthetic value (graphics, colors, figures, text, numeric data, etc.) and contain e.g., textile, leather or rubber materials instead of or in addition to plastics.

Additional elements such as electronics, modules, module internals or parts, and/or optics may be installed and fixed e.g., at the outer surface(s) of the existing structure, such as the exterior surface of an included film or a molded layer depending on the embodiment. For example, optical features such as a lens structure or a diffuser could be constructed or finalized here by processing the thermoplastic layer or any further layer or element thereon by adding material thereon or removing material therefrom (lasering is one option).

Features potentially present in the multilayer structure indeed include various previously discussed features such as diffusers, outcoupling elements, optical masks, holes, graphics, protective and/or aesthetic (and/or tactilely preferred) films or layers, etc. Such features may be provided at this stage or during any previous method item depending on their position and generally configuration in the resulting structure as well as other features to be included. as being understood by a person skilled in the art.

Some features such as outcoupling elements integrally or monolithically formed in a target material as discussed hereinbefore may be provided by modifying the target material such as the material of the substrate film, a further film (e.g. 114, 116, 120, or 122) and/or reflector design through deformation, optionally involving material stretching. Mechanical pressured introduced by a press, for example, may be used for the purpose. Mechanical pressure -induced deformations such as material stretching, breakage and/or undulation taking place inside the structure or on a predefined back side of the structure (not visible e.g., during use) do not need to have any effect on the externally perceivable visuals of the structure.

Furthermore, a feature to be potentially provided in the structure by the method, optionally as a coextruded film layer or through coating, printing or molding as discussed hereinbefore, is or comprises at least one further material layer having a lower refractive index than the plastic layer so that said at least one further material layer and said plastic layer are optically connected, optionally physically adjacent. Accordingly, at least part of the light emitted by at least one light source, propagated within the plastic layer and incident upon the at least one further material layer is reflected (back) into the plastic layer or is essentially kept there by total internal reflection provided that a related critical angle is exceeded. The at least one further material layer may optionally comprise thermoplastic material or optically clear adhesive material or e.g., primer.

Still further, the method may comprise at least one fabrication or installation action selected from the group consisting of:

laminating two or more layers included in the multilayer structure together by pressure-sensitive adhesive, optically clear adhesive, solvent, ink, heat, pressure, or hot melt;

additively producing such as printing or 3D-printing at least one layer such as the plastic layer, a layer of the at least one reflective layer, a further material layer, a lightguide, a light outcoupling element, a diffuser, and/or other optically functional element; and providing a top-emitting light source, optionally LED, on its side on the substrate film so that its contact pads face a direction transverse to the surface of the substrate film and are contacted by conductive adhesive also provided (e.g., dispensed) on the substrate film electrically joining the contact pads with the circuit design, the conductive adhesive being at least partially surrounded on the substrate film by structural adhesive provided on the substrate film (this is a feasible way to turn a top-emitting source operatively into a side-emitting one).

Even still further, the method may comprise interconnecting a plurality of modules together to construct the structure, wherein any or each module advantageously comprises
at least one of
one or more light sources;
at least a portion of the substrate film; and
the circuit design, optionally including a light source driver circuit and/or a capacitive sensing electrode;
or
at least a portion of a layer of the reflector design and/or at least a portion of the plastic layer.

For example, an electronics and/or illumination module may be produced (comprising e.g. light sources, circuit design and optionally further circuitry such as control circuit) as well as a number of simpler modules without e.g., electronics but including e.g., optically transmissive and/or reflective material or structure, and then joined together.

Any of the modules may span several layers of the multilayer structure. In addition to being able to construct a multilayer structure at least partially from modules of different characteristics, several optionally mutually different or similar multilayer structures may be connected to establish even larger, functionally more versatile ensembles as contemplated hereinelsebefore.

If optionally supplementary functionalities such as aforediscussed capacitive sensing of e.g., touch or touchless gestures upon the structure are to be implemented, sensing electrodes of the circuitry may be configured (dimensioned, positioned, etc.) with further elements and layers, with reference to FIG. 15 and related text, so that their sensing area or volume defined by e.g., the associated electric or electromagnetic field is located as desired and thereby covers e.g., the area upon a top surface of the structure and/or other regions that should be made sensitive to touch (and/or touchless gestures in some embodiments) or other sensing target. This type of configuring may be achieved or performed through the utilization of simulation or measurement activities, for instance. Necessary features may be built upon the existing structure in a layer-by-layer fashion or installed as at least partially ready-made stack, for example.

If provided with a connector, the connector of the multilayer structure or ensemble may be connected to a desired external connecting element such as an external connector of an external device, system or structure, e.g., a host device. For example, these two connectors may together form a plug-and-socket type connection and interface. The multilayer structure or ensemble may also be generally positioned and attached herein to a larger ensemble such as an electronic host device, optionally a personal communications device, computer, household apparatus, industrial device, or e.g., a vehicle in embodiments wherein the multilayer structure establishes a part of vehicle exterior or interior, such as a dashboard or a panel.

At 1018, method execution is ended.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario.

The invention claimed is:

1. An integrated optically functional multilayer structure, comprising:
    a flexible, optionally 3D-formable and thermoplastic, substrate film arranged with a circuit design comprising at least a number of electrical conductors additively printed on the substrate film;
    a light source provided upon a first side of the substrate film to internally illuminate at least portion of the structure for external perception;
    an optically transmissive plastic layer, optionally of thermoplastic material, produced upon the first side of the substrate film, said plastic layer at least laterally surrounding, optionally also at least partially covering, the light source, the substrate film optionally comprising material or material layer same as that of the plastic layer or at least having a similar or lower refractive index therewith;
    a reflector design comprising at least one material layer, said reflector design being configured to reflect, optionally dominantly specularly, the light emitted by the light source and incident upon the reflector design optionally towards the plastic layer, the reflector design including a first portion and at least one second portion, the first portion aligned substantially perpendicular to a lateral direction of the structure, the at least one second portion aligned substantially parallel to the lateral direction and vertically offset from the first portion by at least one light guide structure disposed between, and discrete from, the first portion and the at least one second portion; and
    a light outcoupling area on the plastic layer, wherein the light source is located in the lateral direction of the structure between the first portion of the reflector design aligned substantially perpendicular to the lateral direction, and the light outcoupling area, and the light source has been aligned in terms of its primary emission direction towards the portion of the reflector design.

2. The structure of claim 1, wherein the reflectance of the reflector design is at least locally about 75%, at selected wavelengths of light.

3. The structure of claim 1, wherein the reflector design is configured on a direct optical emission path from the light source so as to reflect light incoupled into the plastic layer from the light source and incident on the reflector design to align more with a lateral plane of the plastic layer substantially transverse to a surface normal of the plastic layer.

4. The structure of claim 1, wherein the reflector design is configured on or in the plastic layer to reflect and steer light emitted by the light source and incident on the reflector design to propagate towards an outcoupling area and optionally more towards related surface normal of the plastic layer for outcoupling the light at least from the plastic layer or the overall structure.

5. The structure of claim 1, wherein the reflector design at least locally comprises at least one element selected from the group consisting of:
    electrically conductive material;
    metal, optionally metal particles, further optionally provided upon or within the substrate film or a further film or a layer included in the structure;
    a plurality of stacked, superimposed material layers of at least two mutually different refractive indexes, optionally defining a Bragg mirror;
    thin-film coating, optionally PVD (physical vapor deposition) coating; and
    ink or paint.

6. The structure of claim 1, wherein one or more portions of the reflector design are located on a side of the plastic layer equal, opposite, and/or transverse to a side facing the first side of the substrate film hosting the light source.

7. The structure of claim 1, comprising, in the optical path from the light source towards the exterior of the structure and at the surface of or subsequent to the plastic layer, at least one element selected from the group consisting of: optical print layer, coating or film comprising opaque or translucent material relative to the light emitted by the light source, optical mask, dented surface such as the surface of the plastic layer optionally defining one or more prismatic dent shapes, layer of optically at least translucent if not transparent material with a refractive index lower than of optically subsequent, adjacent material such as air, layer of alternating higher and lower refractive index materials, perforated, holey or otherwise locally thinned or through-cut layer of opaque material, and adhesion promoting primer.

8. The structure of claim 1, wherein the light source comprises a semiconductor, a packaged semiconductor, a chip-on-board semiconductor, bare chip, electroluminescent or a printed type light source, preferably LED, optionally a multi-color such as RGB (red-green-blue) LED.

9. The structure of claim 1, comprising at least one further, optionally printed, material layer, optionally stacked and in contact with the reflector design, said at least one further material layer having a lower refractive index than the plastic layer, said at least one further material layer and said plastic layer being optically connected, optionally physically adjacent, so as to redirect at least part of the light emitted by the light source, propagated within the plastic layer and incident upon the at least one further material layer back into the plastic layer by total internal reflection, said at least one further material layer optionally comprising or consisting of optically clear adhesive or primer.

10. The structure of claim 9, wherein a layer of the at least one further material layer is a layer of the substrate film of multilayer, optionally co-extruded, type comprising also a hosting layer for the light source.

11. The structure of claim 9, comprising an intermediate layer between the plastic layer and a layer of said at least one further material layer, the intermediate layer comprising optically transmissive material which is the same as that of the plastic layer or having at least a similar refractive index therewith, said intermediate layer and the layer of said at least one further material layer optionally being constituents of a multilayer film, further optionally being a co-extruded multilayer film and/or substrate type multilayer film, hosting a number of elements such as optical elements, a circuit design or one or more electronic components, laminated upon the plastic layer.

12. The structure of claim 9, wherein at least portion of the reflector design and the at least one further material layer are mutually on the same, opposite, or both sides of the plastic layer.

13. The structure of claim 9, wherein a layer of the reflector design, a layer of the at least one further material layer, and the plastic layer are at least locally superimposed in terms of their materials so that the material of the layer of the at least one further material layer is stacked between the materials of the layer of the reflector design and the plastic layer.

14. An integrated optically functional multilayer structure, comprising:
- a flexible substrate film arranged with a circuit design comprising at least a number of electrical conductors additively printed on the substrate film;
- a light source produced upon on a first side of the substrate film;
- an optically transmissive plastic layer produced upon the first side of the substrate film, said plastic layer at least laterally surrounding the light source;
- a reflector design comprising at least one material layer, the reflector design being configured to reflect the light emitted by the light source and incident upon the reflector design, the reflector design including a first portion and at least one second portion, the first portion aligned substantially perpendicular to a lateral direction of the structure, the at least one second portion aligned substantially parallel to the lateral direction and vertically offset from the first portion by at least one optically functional structure disposed between, and discrete from, the first portion and the at least one second portion; and
- a light outcoupling area on the plastic layer, wherein the light source is located in the lateral direction of the structure between the first portion of the reflector design aligned substantially perpendicular to the lateral direction, and the light outcoupling area, and the light source aligned in terms of its primary emission direction towards the portion of the reflector design.

15. The structure of claim 14, wherein the at least one material layer of the reflector design includes a plurality of stacked, superimposed material layers of at least two mutually different refractive indexes, optionally defining a Bragg mirror.

16. The structure of claim 15, wherein the plurality of stacked, superimposed material layers alternate in a sequence.

* * * * *